US012727246B2

(12) United States Patent
Hu et al.

(10) Patent No.: US 12,727,246 B2
(45) Date of Patent: Sep. 1, 2026

(54) DISPLAY BACKPLANE AND DISPLAY DEVICE

(71) Applicant: WUHAN CHINA STAR OPTOELECTRONICS TECHNOLOGY CO., LTD., Wuhan (CN)

(72) Inventors: Zemin Hu, Wuhan (CN); Chao Wang, Wuhan (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 1150 days.

(21) Appl. No.: 17/755,862

(22) PCT Filed: Apr. 22, 2022

(86) PCT No.: PCT/CN2022/088331

§ 371 (c)(1),
(2) Date: Oct. 19, 2023

(87) PCT Pub. No.: WO2023/197352

PCT Pub. Date: Oct. 19, 2023

(65) Prior Publication Data

US 2024/0162243 A1 May 16, 2024

(30) Foreign Application Priority Data

Apr. 11, 2022 (CN) ......................... 202210375069.7

(51) Int. Cl.
*H10D 86/60* (2025.01)
*H10D 86/40* (2025.01)

(52) U.S. Cl.
CPC .......... *H10D 86/60* (2025.01); *H10D 86/443* (2025.01)

(58) Field of Classification Search
CPC ................................ H01L 27/12; H01L 27/15
See application file for complete search history.

(56) References Cited

U.S. PATENT DOCUMENTS

2010/0045921 A1 2/2010 Wang et al.
2023/0207733 A1* 6/2023 Gong .................. H10K 59/131 257/79

(Continued)

FOREIGN PATENT DOCUMENTS

CN 104865764 A 8/2015
CN 108565257 A 9/2018

(Continued)

OTHER PUBLICATIONS

Chinese Office Action issued in corresponding Chinese Patent Application No. 202210375069.7 dated Feb. 28, 2025, pp. 1-10.

(Continued)

*Primary Examiner* — Joseph L Williams
(74) *Attorney, Agent, or Firm* — PV IP PC; Wei Te Chung

(57) ABSTRACT

A display backplane and a display device are provided. The display backplane includes a wiring layer. The wiring layer includes a plurality of first-type wirings arranged along a first direction and a plurality of second-type wirings arranged along a second direction. At least one of the first-type wirings includes a first end surface flush with an edge of the display backplane. At least one of the second-type wirings includes a second end surface flush with the edge of the display backplane. In a top view direction of the display backplane, the first end surface and the second end surface are arranged non-overlapping.

20 Claims, 19 Drawing Sheets

(56) References Cited

U.S. PATENT DOCUMENTS

| | | | | |
|---|---|---|---|---|
| 2026/0090419 | A1* | 3/2026 | Baek | G09G 3/2096 |
| 2026/0112327 | A1* | 4/2026 | Fang | G09G 3/3607 |

FOREIGN PATENT DOCUMENTS

| | | | |
|---|---|---|---|
| CN | 109188810 | A | 1/2019 |
| CN | 109830197 | A | 5/2019 |
| CN | 110634833 | A | 12/2019 |
| CN | 110908202 | A | 3/2020 |
| CN | 111900174 | A | 11/2020 |
| CN | 212182326 | U | 12/2020 |
| CN | 112599543 | A | 4/2021 |

OTHER PUBLICATIONS

International Search Report in International application No. PCT/CN2022/088331, mailed on Dec. 15, 2022.

Written Opinion of the International Search Authority in International application No. PCT/CN2022/088331, mailed on Dec. 15, 2022.

* cited by examiner

DISPLAY BACKPLANE AND DISPLAY DEVICE

FIELD OF DISCLOSURE

The present disclosure relates to the field of displays, in particular to a display backplane and a display device.

BACKGROUND

In recent years, large-sized display devices have become more and more popular among consumers. It is difficult to produce a large-sized display device through a whole surface, and it needs to be obtained by splicing multiple splicing screens. The splicing screens can be cut from a slightly larger size substrate to a smaller size display backplane. At present, during cutting a substrate, when cutting to adjacent metal line layers, it is easy to generate line connections while cutting a side surface. If the connected lines are different types of signals, abnormal short-circuits will occur, resulting in abnormal display.

Therefore, it is necessary to provide a display backplane and a display device to solve the above technical problem.

SUMMARY OF DISCLOSURE

The present disclosure provides a display backplane and a display device, which can solve a technical problem of abnormal short-circuiting of different types of lines caused by cutting a side surface when cutting a substrate.

In order to solve the above problem, technical solutions provided by the present disclosure are as follows:

An embodiment of the present disclosure provides a display backplane, the display backplane includes a wiring layer, and the wiring layer includes:

- a plurality of first-type wirings arranged along a first direction, where at least one of the first-type wirings includes a first end surface that is flush with an edge of the display backplane; and
- a plurality of second-type wirings arranged along a second direction, where the first direction is perpendicular to the second direction, and at least one of the second-type wirings includes a second end surface that is flush with the edge of the display backplane.

The first-type wirings are insulated from the second-type wirings, and in a top view direction of the display backplane, the first end surface and the second end surface are arranged non-overlapping.

Preferably, any one of the first end surfaces is parallel to the second direction, and any one of the second end surfaces is parallel to the first direction.

Preferably, the wiring layer includes a first metal layer, a second metal layer, and an insulating layer disposed between the first metal layer and the second metal layer. The first end surface parallel to the second direction includes a first sub-surface disposed in the second metal layer, and the second end surface parallel to the first direction includes a second sub-surface disposed in the first metal layer.

Preferably, the first-type wiring including the first sub-surface includes: a first portion arranged close to a corresponding edge of the display backplane, and disposed in the second metal layer; and a second portion, arranged away from the corresponding edge of the display backplane, and disposed in the first metal layer. The second-type wiring including the second sub-surface includes: a third portion arranged close to the corresponding edge of the display backplane, and disposed in the first metal layer; and a fourth portion arranged away from the corresponding edge of the display backplane, and disposed in the second metal layer. The insulating layer includes a plurality of first via holes and a plurality of second via holes, the first portion is connected to the second portion through the first via holes, and the third portion is connected to the fourth portion through the second via holes.

Preferably, the first end surface including the first sub-surface also includes a third sub-surface disposed in the first metal layer, and the second end surface including the second sub-surface also includes a fourth sub-surface disposed in the second metal layer. In the top view direction of the display backplane, the first sub-surface correspondingly overlaps with the third sub-surface, and the second sub-surface correspondingly overlaps with the fourth sub-surface.

Preferably, the display backplane includes a first edge parallel to the first direction and a second edge parallel to the second direction. One of the first-type wirings closest to the first edge includes a first protrusion toward to the first edge, and one of the second-type wirings closest to the second edge including a second protrusions toward the second edge.

Preferably, in the top view direction of the display backplane, a side surface of the first protrusion close to the first edge is flush with the first edge, and a side surface of the second protrusion close to the second edge is flush with the second edge.

Preferably, at least one of the first end surfaces is parallel to the second direction, at least one of the first end surfaces is parallel to the first direction, at least one of the second end surfaces is parallel to the second direction, and at least one of the second end surfaces is parallel to the first direction.

Preferably, the wiring layer includes a first metal layer, a second metal layer, and an insulating layer disposed between the first metal layer and the second metal layer. The first end surface parallel to the second direction includes a first sub-surface disposed in the second metal layer, and the second end surface parallel to the first direction includes a second sub-surface disposed in the first metal layer.

Preferably, the display backplane includes a first edge parallel to the first direction and a second edge parallel to the second direction. One of the first-type wirings closest to the first edge includes the first protrusion toward the first edge, and one of the second-type wirings closest to the second edge includes a second protrusions toward the second edge.

Preferably, the display backplane includes at least one virtual cutting frame. At least one of the first-type wirings includes a first virtual end surface, and at least one of the second-type wirings includes a second virtual end surface. In the top view direction of the display backplane, the first virtual end surface overlaps with the virtual cutting frame, the second virtual end surface overlaps with the virtual cutting frame, and the first virtual end surface and the second virtual end surface are arranged non-overlapping.

Preferably, the virtual cutting frame includes a first virtual cutting line parallel to the first direction and a second virtual cutting line parallel to the second direction. At least one of the first-type wirings includes at least one first opening, and at least one of the second-type wirings includes at least one second opening. In the top view direction of the display backplane, the first virtual cutting line passes through the first opening, at least one of the second-type wirings passes through the first opening, the second virtual cutting line passes through the second opening, and at least one of the first-type wirings passes through the second opening.

Preferably, the virtual cutting frame includes a first virtual cutting line parallel to the first direction and a second virtual cutting line parallel to the second direction. In the top view direction of the display backplane, the first virtual cutting line is disposed between two adjacent first-type wirings, and the second virtual cutting line is disposed between two adjacent second-type wirings.

Preferably, the wiring layer includes a first metal layer, a second metal layer, and an insulating layer disposed between the first metal layer and the second metal layer. The first virtual end surface includes a first virtual sub-surface disposed in the second metal layer, and the second virtual end surface includes a second virtual sub-surface disposed in the first metal layer.

Preferably, the first-type wiring including the first virtual sub-surface includes: a first sub-portion disposed in the second metal layer, where in the top view direction of the display backplane, the first sub-portion passes through the virtual cutting frame; and a second sub-portion disposed in the first metal layer. The second-type wiring including the second virtual sub-surface includes: a third sub-portion disposed in the first metal layer, where in the top view direction of the display backplane, the third sub-portion passes through the virtual cutting frame; and a fourth sub-portion disposed in the second metal layer. The insulating layer includes a plurality of third via holes and a plurality of fourth via holes, the second sub-portion is connected to both ends of the first sub-portion through the third via holes, and the fourth sub-portion is connected to both ends of the third sub-portion through the fourth via holes.

Preferably, the first virtual end surface including the first virtual sub-surface further includes a third virtual sub-surface disposed in the first metal layer, and the second virtual end surface including the second virtual sub-surface also includes a fourth virtual sub-surface disposed in the second metal layer. In the top view direction of the display backplane, the first virtual sub-surface overlaps with the corresponding third virtual sub-surface, and the second virtual sub-surface overlaps with the corresponding fourth virtual sub-surface.

Preferably, in the top view direction of the display backplane, a cutting line of the virtual cutting frame is disposed between two adjacent sub-pixels of the display backplane.

Preferably, the display backplane includes a display area and a non-display area at a bottom of the display area, and the display backplane further includes a gate driving component disposed in the display area.

Preferably, the gate driving component includes a plurality of gate driving devices and a gate driving connecting line connecting two adjacent gate driving devices. In the top view direction of the display backplane, an arrangement direction of the gate driving connecting line and the gate driving devices is perpendicular to an edge of the display backplane, and the gate driving connecting line includes an end surface that is flush with the corresponding edge.

An embodiment of the present disclosure provides a display device, including at least two splicing screens. One of the splicing screens includes a display backplane, the display backplane includes a wiring layer, and the wiring layer includes:

- a plurality of first-type wirings arranged along a first direction, where at least one of the first-type wirings includes a first end surface that is flush with an edge of the display backplane; and
- a plurality of second-type wirings arranged along a second direction, where the first direction is perpendicular to the second direction, and at least one of the second-type wirings includes a second end surface that is flush with the edge of the display backplane.

The first-type wirings are insulated from the second-type wirings, and in a top view direction of the display backplane, the first end surface and the second end surface are arranged non-overlapping.

In the present disclosure, by optimizing an arrangement and patterning of the wirings, the cutting line is arranged in a region where two different types of wirings do not overlap. It prevents different types of wirings from being cut at the same time, thereby reducing a risk of abnormal short-circuiting of different types of lines caused by cutting, improving a product yield of the display backplane, and improving a display performance.

DETAILED DESCRIPTION

Figure 1:
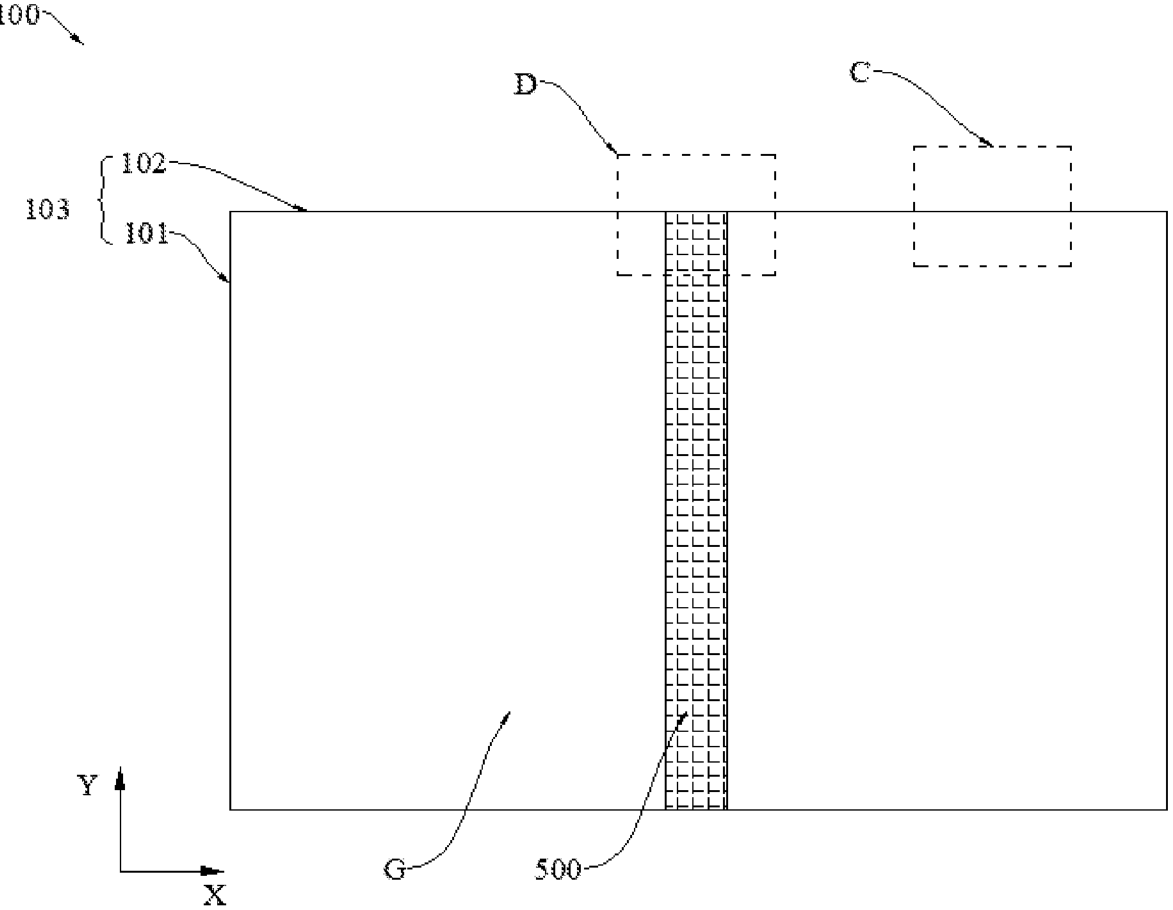
FIG. 1 is a schematic top view of a first structure of a display backplane of an embodiment of the present disclosure.

The present disclosure provides a display backplane and a display device. In order to make the purpose, technical solutions, and effects of the present disclosure more clear and specific, the present disclosure will be described in further detail below with reference to accompanying drawings and embodiments. It should be understood that the specific embodiments described herein are only used to explain the present disclosure, but not to limit the present disclosure.

Embodiments of the present disclosure provide a display backplane and a display device. Each of them will be described in detail below. It should be noted that the description order of the following embodiments is not intended to limit the preferred order of the embodiments.

Referring to FIG. 1 to FIG. 27, embodiments of the present disclosure provide a display backplane 100, and the display backplane 100 includes a wiring layer. The wiring layer includes a plurality of first-type wirings 200 and a plurality of second-type wirings 300.

The plurality of first-type wirings 200 are arranged along a first direction. At least one of the first-type wirings 200 includes a first end surface 210 that is flush with an edge 103 of the display backplane 100.

The plurality of second-type wirings 300 are arranged along a second direction. The first direction is perpendicular to the second direction, and at least one of the second-type wirings 300 includes a second end surface 310 that is flush with the edge 103 of the display backplane 100.

In a top view direction of the display backplane 100, the first end surface 210 and the second end surface 310 are arranged non-overlapping.

In the present disclosure, by optimizing an arrangement and patterning of the wirings, a cutting line is arranged in a region where two different types of wirings do not overlap. It prevents different types of wirings from being cut at the same time, thereby reducing a risk of abnormal short-circuiting of different types of lines caused by cutting, improving a product yield of the display backplane, and improving a display performance.

The technical solutions of the present disclosure will now be described with reference to specific embodiments.

Figure 3:
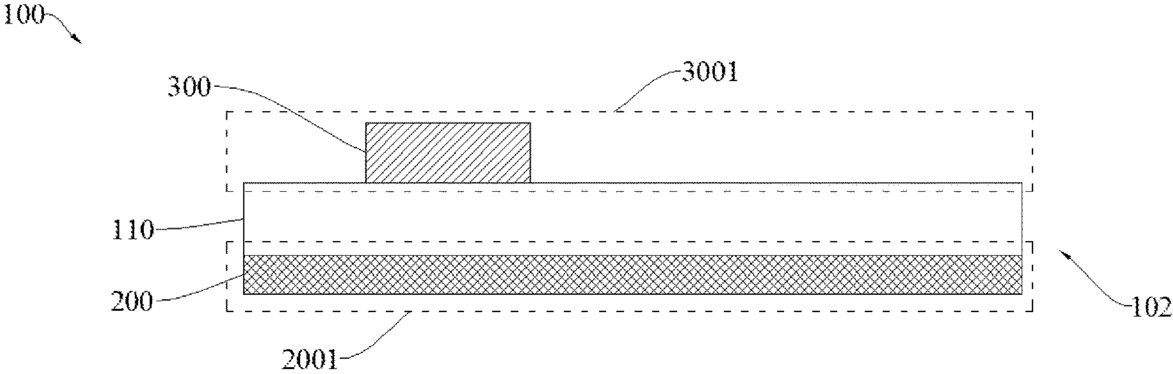
FIG. 3 is a cross-sectional view along A1A2 of FIG. 2.
Figure 12:
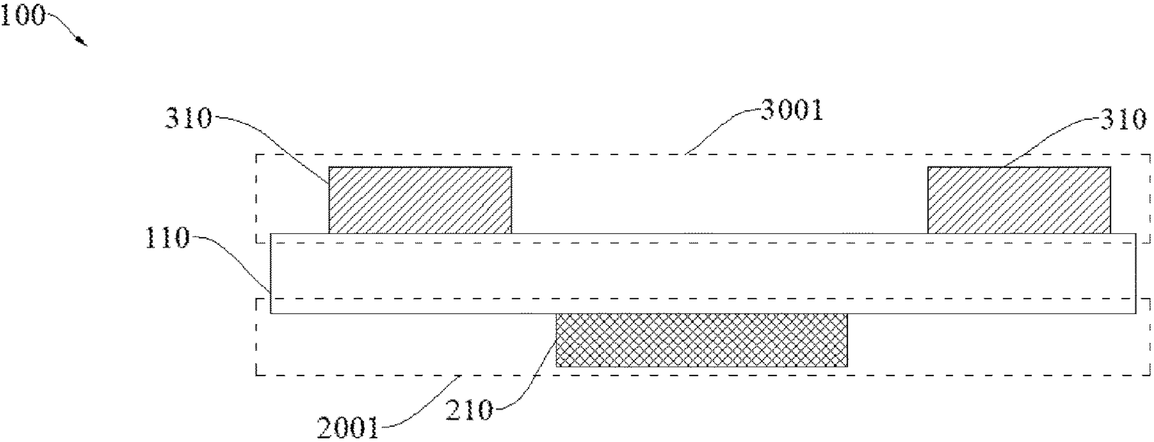
FIG. 12 is a cross-sectional view along B1B2 of FIG. 10.

In this embodiment, refer to FIG. 1, FIG. 3, and FIG. 12, a display backplane 100 includes a wiring layer. The wiring layer includes a plurality of first-type wirings 200 arranged along a first direction and a plurality of second-type wirings 300 arranged along a second direction. At least one of the first-type wirings 200 includes a first end surface 210 that is flush with an edge 103 of the display backplane 100. The first direction is perpendicular to the second direction. At least one of the second-type wirings 300 includes a second end surface 310 that is flush with the edge 103 of the display backplane 100. In a top view direction of the display backplane 100, the first end surface 210 and the second end surface 310 are arranged non-overlapping.

When cutting a substrate 700, in a cutting direction perpendicular to the substrate 700, a cutting line only passes through one type of wirings at the same time. In the top view direction, the different types of wirings that overlap with the cutting line do not have overlapping regions. Thus, after the substrate 700 is cut, there is no region where different types of wirings overlap each other on the edge 103 of the display backplane 100. It prevents different types of wirings from being cut at the same time, thereby reducing a risk of abnormal short-circuiting of different types of wirings caused by cutting, improving a product yield of the display backplane 100, and improving a display performance.

In this specification, the first direction is a Y-axis direction and the second direction is an X-axis direction as an example. It can be understood that, in order to avoid repeated drawing, the second-type wirings 300, a corresponding second edge 10, a second virtual cutting line 42, and a second cutting line 820 are taken as examples for description.

Figure 2:
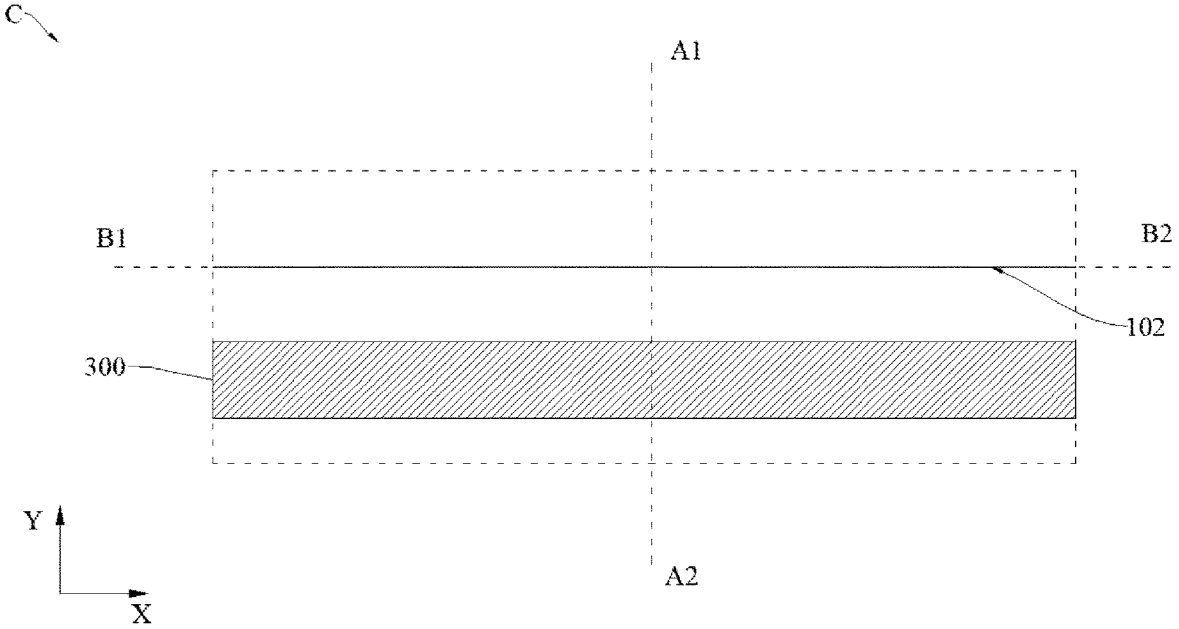
FIG. 2 is a first enlarged view of a region C of FIG. 1.
Figure 4:
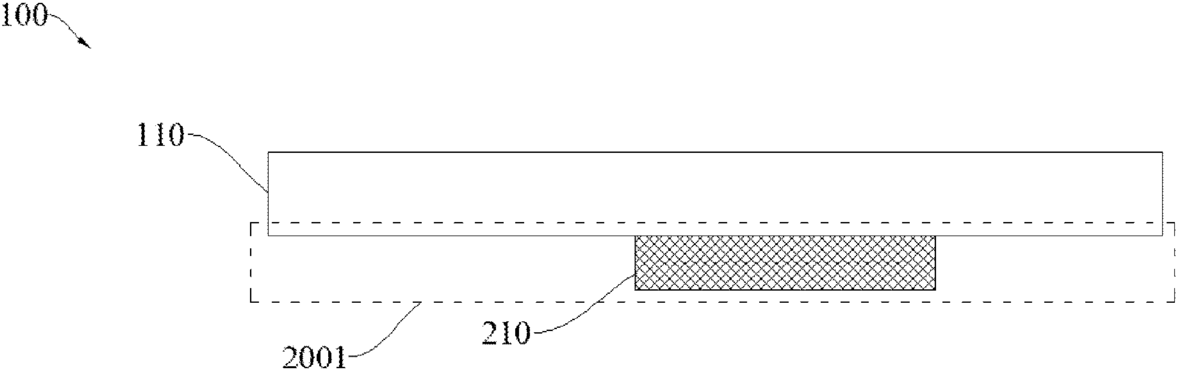
FIG. 4 is a cross-sectional view along B1B2 of FIG. 2.

In some embodiments, refer to FIG. 2 to FIG. 4, the wiring layer includes a first metal layer 2001, a second metal layer 3001, and an insulating layer 110 disposed between the first metal layer 2001 and the second metal layer 3001.

In some embodiments, refer to FIG. 2 to FIG. 4, any one of the first end surfaces 210 is parallel to the second direction, and any one of the second end surfaces 310 is parallel to the first direction.

A cutting frame 800 includes a first cutting line 810 parallel to the first direction and a second cutting line 820 parallel to the second direction. During cutting, in the top view direction of the display backplane 100, the first cutting line 810 is arranged between two adjacent first-type wirings 200, and the second cutting line 820 is arranged between two adjacent second-type wirings 300. The first cutting line 810 will only cut to the second-type wirings 300. The second cutting line 820 will only cut to the first-type wirings 200. Thus, different types of wirings are prevented from being cut at the same time, thereby reducing the risk of abnormal short-circuiting of different types of wirings caused by cutting, improving the product yield of the display backplane 100, and improving the display performance.

Figure 10:
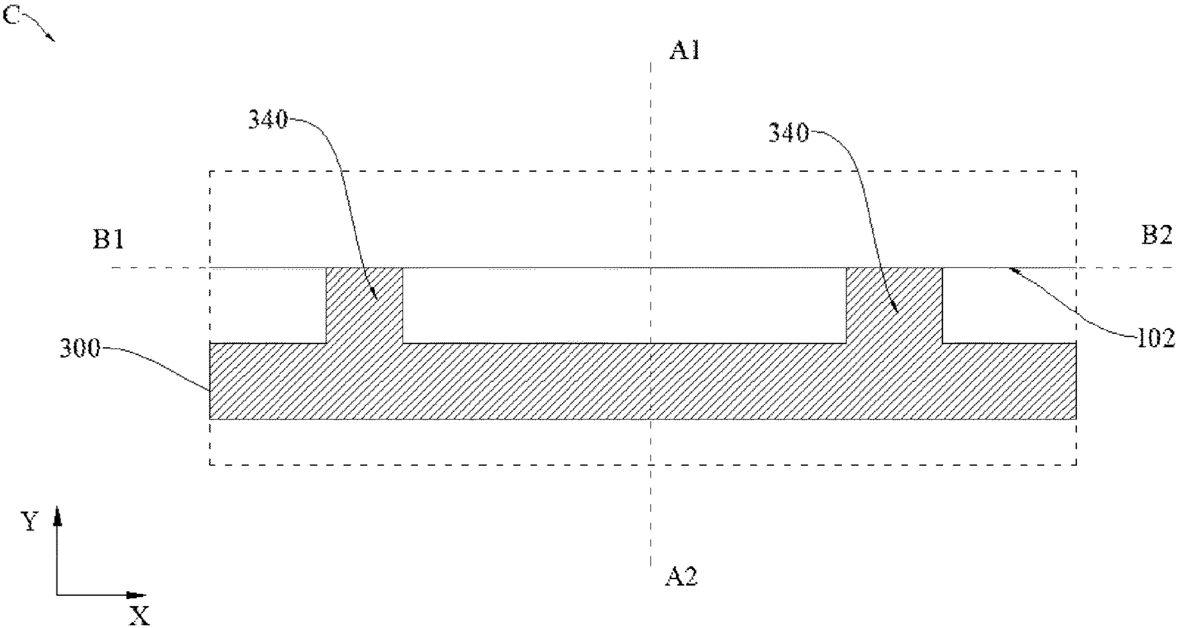
FIG. 10 is a third enlarged view of a region C of FIG. 1.
Figure 11:
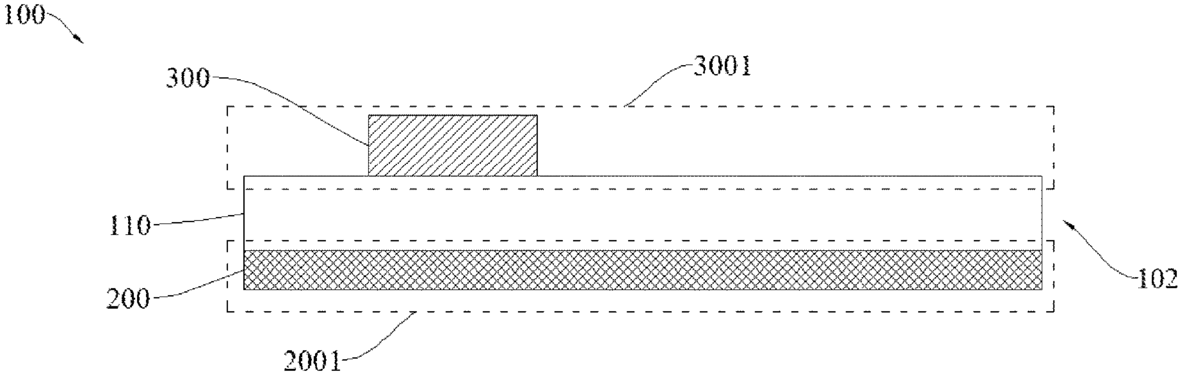
FIG. 11 is a cross-sectional view along A1A2 of FIG. 10.

In some embodiments, refer to FIG. 10 to FIG. 12, at least one of the first end surfaces 210 is parallel to the second direction. At least one of the first end surfaces 210 is parallel to the first direction. At least one of the second end surfaces 310 is parallel to the second direction. At least one of the second end surfaces 310 is parallel to the first direction.

Figure 15:
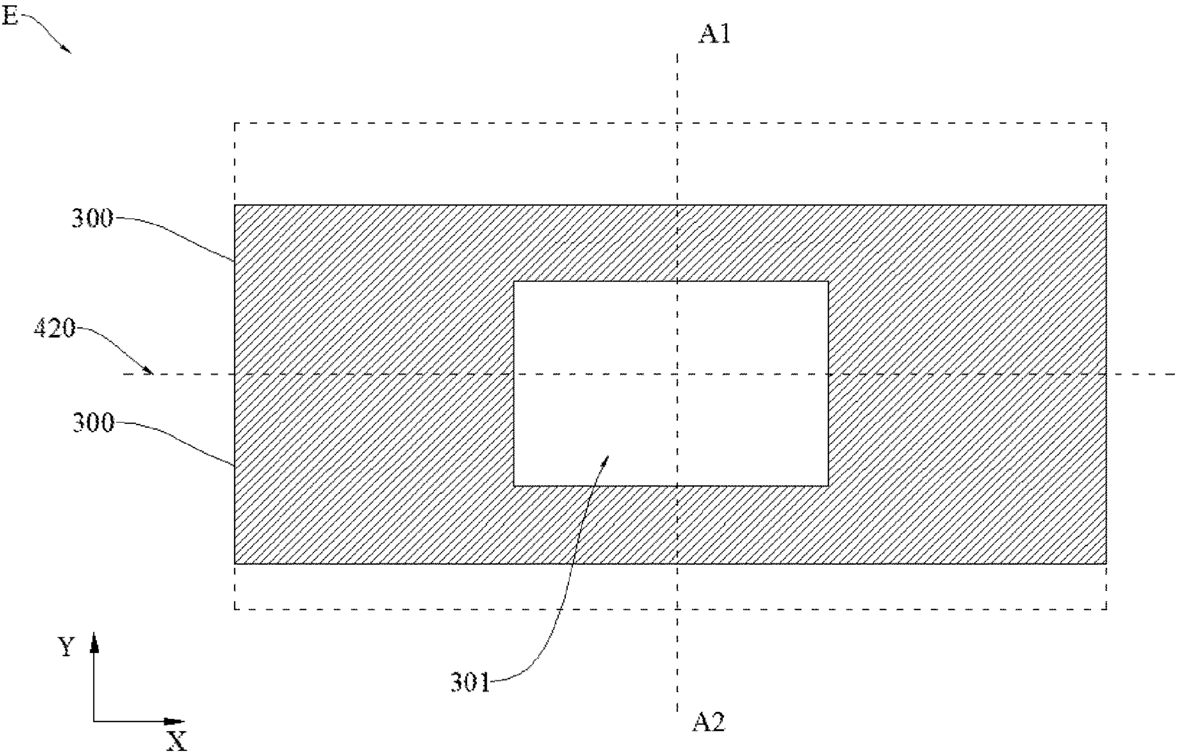
FIG. 15 is a first enlarged view of a region E of FIG. 14.
Figure 16:
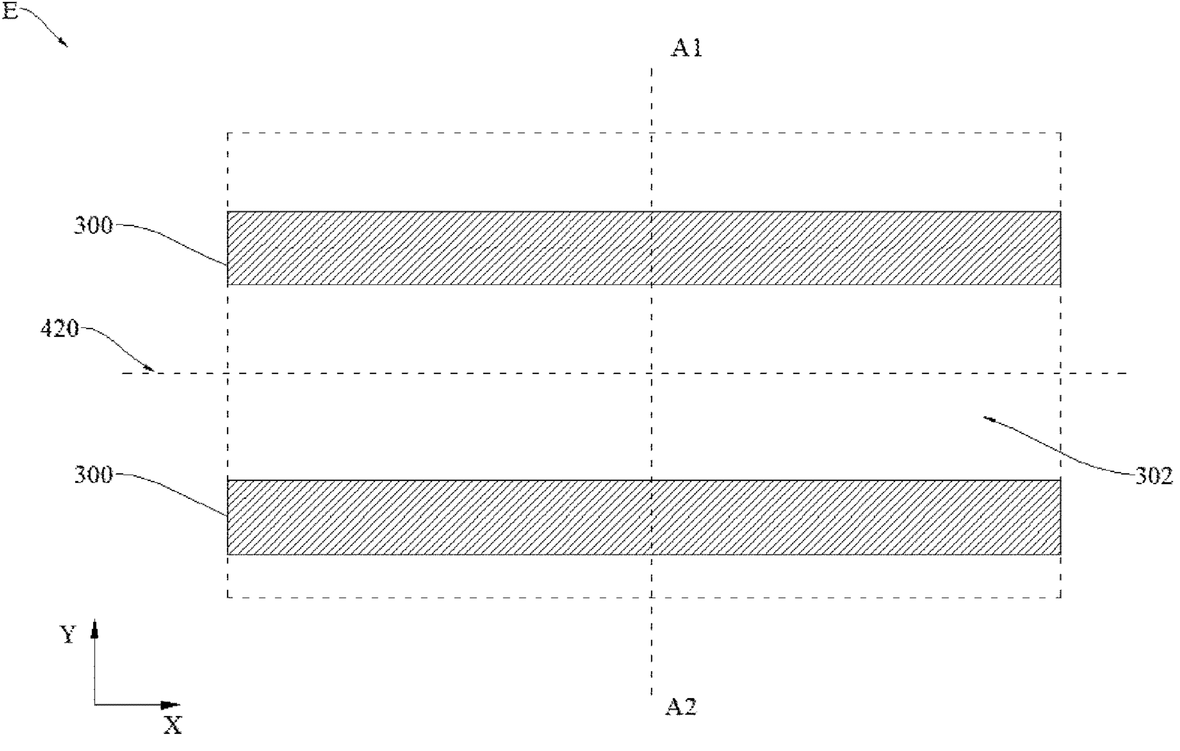
FIG. 16 is a second enlarged view of a region E of FIG. 14.
Figure 17:
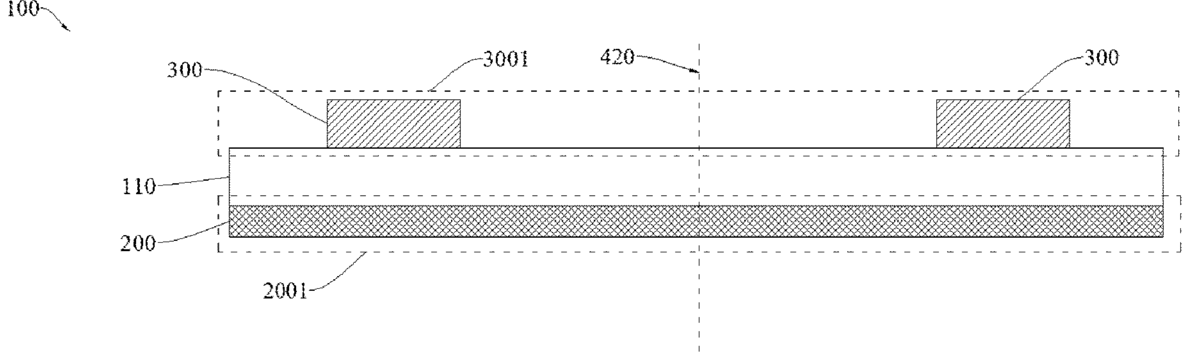
FIG. 17 is a cross-sectional view along A1A2 of FIG. 15 or FIG. 16.
Figure 18:
FIG. 18 is a cross-sectional view along a second virtual cutting line 420 of FIG. 16.
Figure 18:
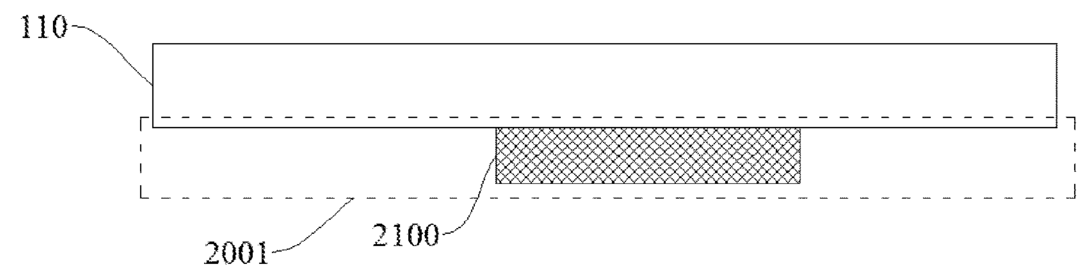

When arranging the wirings, refer to FIG. 15 and FIG. 16 (taking a virtual cutting line as an example), the first-type wirings 200 include at least one first opening, and at least one of the second-type wirings 300 includes at least one second opening 301. In the top view direction of the display backplane 100, at least one of the first-type wirings 200 passes through the second opening 301, at least one of the second-type wirings 300 passes through the first opening, the first cutting line 810 passes through the first opening, and the second cutting line 820 passes through the second opening 301. Alternatively, a gap 302 between two adjacent first-type wirings 200 or two adjacent second-type wirings 300 is patterned so that a portion of an edge of the gap is located on the cutting line. In the top view direction of the display backplane 100, a space occupied by the metal wirings is increased, and the metal wirings can reflect light, which can improve the reflection of display light, thereby improving a display luminous efficiency.

Figure 7:
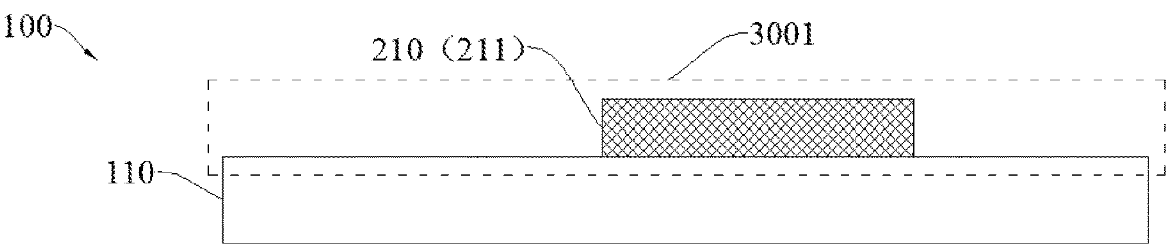
FIG. 7 is a first cross-sectional view along B1B2 of FIG. 5.
Figure 9:
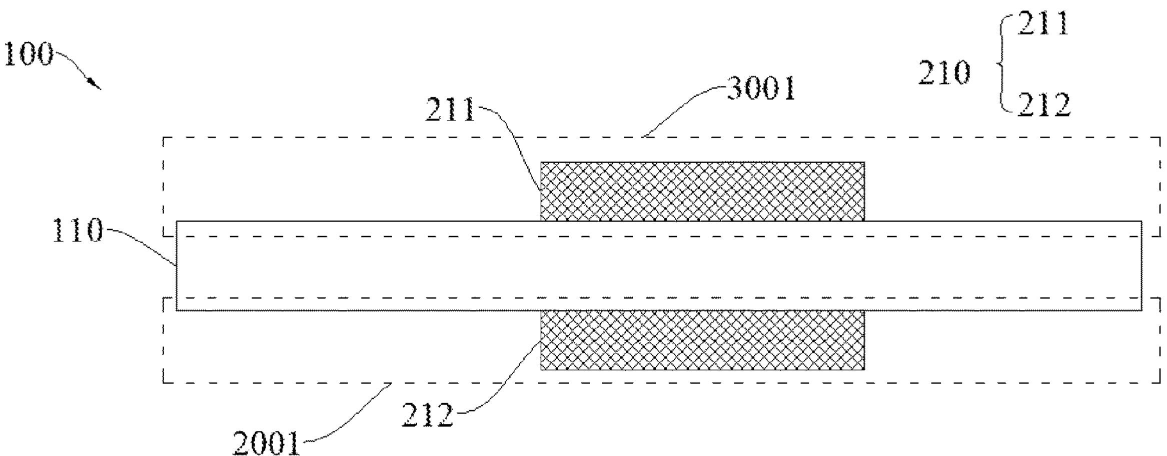
FIG. 9 is a second cross-sectional view along B1B2 of FIG. 5.

In some embodiments, refer to FIG. 7 and FIG. 9, the first end surface 210 parallel to the second direction includes a first sub-surface 211 disposed in the second metal layer 3001. The second end surface 310 parallel to the first direction includes a second sub-surface disposed in the first metal layer 2001.

The first-type wirings 200 originally in the first metal layer 2001 can be arranged at the edge 103 of the display backplane 100, that is, at the cutting line. The first-type wirings 200 perpendicular to the corresponding cutting lines are changed to the second metal layer 3001. In this way, at the corresponding cutting line, for the first metal layer 2001 and the second metal layer 3001, only one layer of the two is cut (only the second metal layer 3001 is cut when the first-type wirings 200 are changed). This further reduces the risk of short-circuiting of different types of signal wirings in different layers. The method and principle of the second-type wirings 300 are the same, thereby reducing the risk of abnormal short-circuiting of different types of wirings caused by cutting, improving the product yield of the display backplane 100, and improving the display performance.

In some embodiments, refer to FIG. 5 to FIG. 9, the first-type wiring 200 including the first sub-surface 211 includes a first portion 220 and a second portion 230. The first portion 220 is arranged close to a corresponding edge 103 of the display backplane 100, and disposed in the second metal layer 3001. The second portion 230 is arranged away from the corresponding edge 103 of the display backplane 100, and disposed in the first metal layer 2001. The second-type wiring 300 including the second sub-surface includes a third portion and a fourth portion. The third portion is arranged close to the corresponding edge 103 of the display backplane 100, and disposed in the first metal layer 2001. The fourth portion is arranged away from the corresponding edge 103 of the display backplane 100, and disposed in the second metal layer 3001. The insulating layer 110 includes a plurality of first via holes 111 and a plurality of second via holes, the first portion 220 is connected to the second portion 230 through the first via holes 111, and the third portion is connected to the fourth portion through the second via holes.

The first-type wirings 200 are connected to the second metal layer 3001 through the first via holes 111 for jumper wiring. The second-type wirings 300 are connected to the first metal layer 2001 through the second via holes for jumper wiring. At the corresponding cutting line, for the first metal layer 2001 and the second metal layer 3001, only one layer of the two is cut, which further reduces the risk of short-circuiting of different types of signal wirings in different layers. The wire changing method and principle of the second-type wirings 300 are the same. Thus, the risk of abnormal short-circuiting of different types of wirings caused by cutting is reduced, the product yield of the display backplane 100 is improved, and the display performance is improved.

Figure 5:
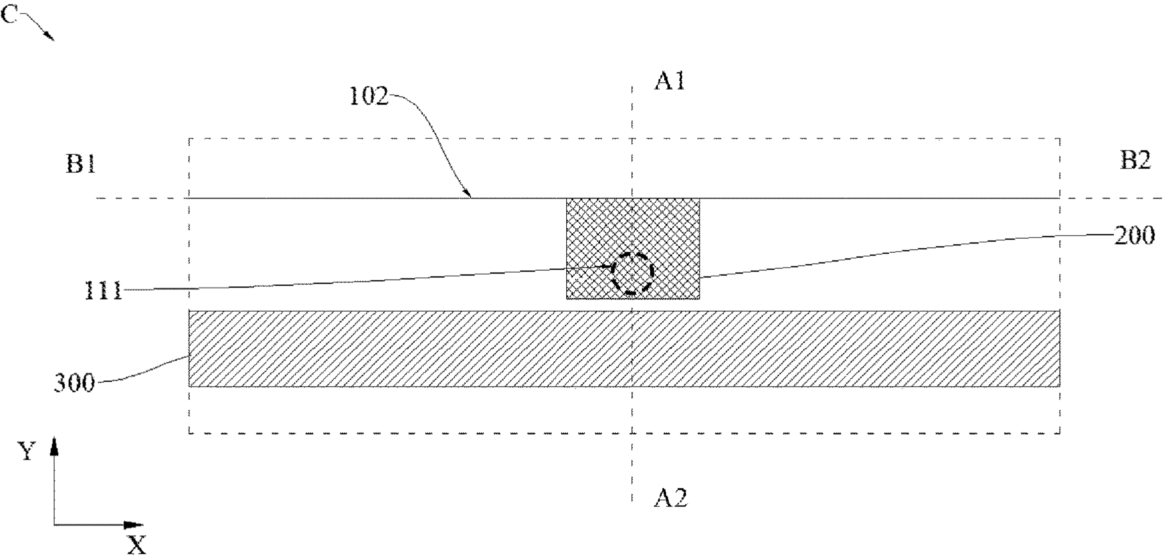
FIG. 5 is a second enlarged view of a region C of FIG. 1.
Figure 6:
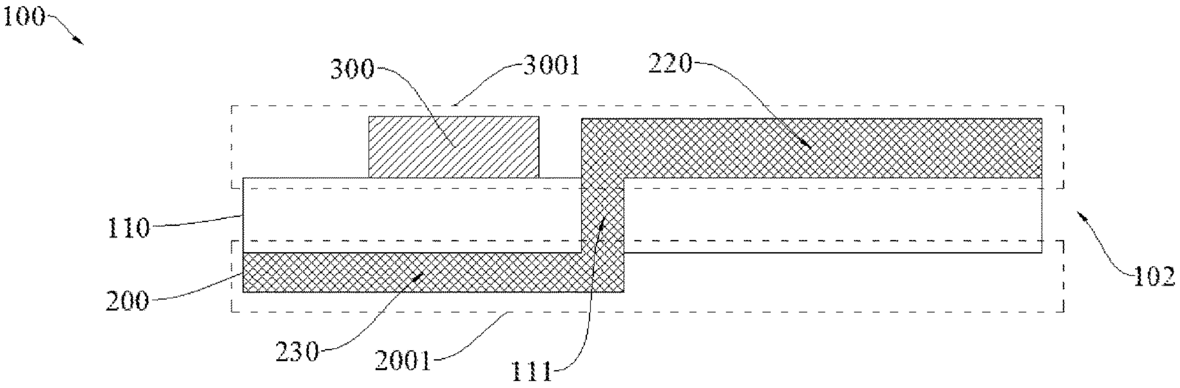
FIG. 6 is a first cross-sectional view along A1A2 of FIG. 5.
Figure 8:
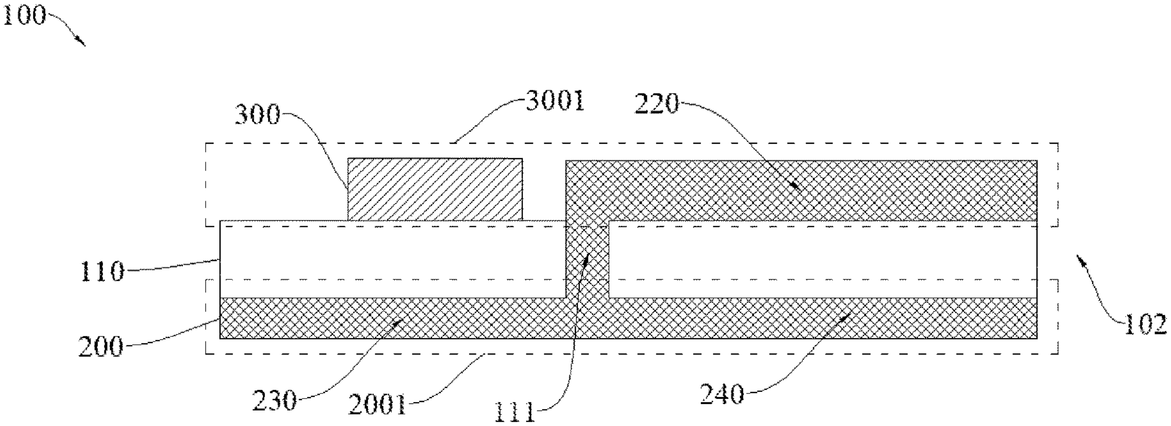
FIG. 8 is a second cross-sectional view along A1A2 of FIG. 5.

In some embodiments, refer to FIG. 5, FIG. 8, and FIG. 9, the first end surface 210 including the first sub-surface 211 also includes a third sub-surface 212 disposed in the first metal layer 2001. The second end surface 310 including the second sub-surface also includes a fourth sub-surface disposed in the second metal layer 3001. In the top view direction of the display backplane 100, the first sub-surface 211 overlaps with the corresponding third sub-surface 212, and the second sub-surface overlaps with the corresponding fourth sub-surface.

At cutting surfaces of different layers, upper and lower overlapping regions correspond to the two signal wirings of the same type. Even if upper and lower wirings are shorted during cutting (for example, wirings corresponding to the first sub-surface 211 and the third sub-surface 212 of the first-type wirings 200 are short-circuited on a side surface), the two wirings are the same wirings of the same type of wirings, and there is no need to worry about short-circuit causing abnormal signal, and parallel connection can be realized to reduce the line resistance. It is not necessary to interrupt the first-type wirings 200 or the second-type wirings 300 within each pixel. Thus, a design scheme of the original pixel is less affected. At the same time, for the original pixel design, there is no need to interrupt the metal layer many times, and it has almost no effect on the impedance of the metal wirings. Therefore, the risk of abnormal short-circuiting of different types of wirings caused by cutting is reduced, the product yield of the display backplane 100 is improved, and the display performance is improved.

In some embodiments, refer to FIG. 5, FIG. 8, and FIG. 9, the first-type wiring 200 including the first sub-surface 211 also includes a fifth portion 240 connected to the second portion 230 and arranged in the same layer as the second portion 230. The second-type wiring 300 including the second sub-surface also includes a sixth portion connected to the fourth portion and arranged in the same layer as the fourth portion.

The fifth portion 240 corresponds to the third sub-surface 212, and the sixth portion corresponds to the fourth sub-surface. During cutting, for example, the first portion 220 and the fifth portion 240 of the first-type wirings 200 are short-circuited at the side surface. The two wirings are the same wirings of the same type of wirings, and there is no need to worry about short-circuit causing abnormal signal, and parallel connection can be realized to reduce the line resistance. Therefore, the risk of abnormal short-circuiting of different types of wirings caused by cutting is reduced, the product yield of the display backplane 100 is improved, and the display performance is improved.

In some embodiments, refer to FIG. 1 and FIG. 10, the display backplane 100 includes a first edge 101 parallel to the first direction and a second edge 102 parallel to the second direction. One of the first-type wirings 200 closest to the corresponding first edge 101 includes a first protrusion toward the corresponding first edge 101. One of the second-type wirings 300 closest to the corresponding second edge 102 includes a second protrusion 340 toward the corresponding second edge 102.

In the top view direction of the display backplane 100, the first protrusion and the second protrusion 340 can increase a space occupied by the metal wirings, and the metal wirings can reflect light, which can improve the reflection of display light, thereby improving a display luminous efficiency.

In some embodiments, refer to FIG. 1 and FIG. 10 to FIG. 12, in the top view direction of the display backplane 100, a side surface of the first protrusion close to the first edge 101 is flush with the first edge 101, and a side surface of the second protrusion 340 close to the second edge 102 is flush with the second edge 102.

The first protrusion and the second protrusion 340 are utilized to maximize the filling of the gaps of the metal wirings, thereby improving the reflection of the display light, and increasing the display luminous efficiency.

In some embodiments, refer to FIG. 14, FIG. 18, FIG. 21, FIG. 24, and FIG. 26, the display backplane 100 includes at least one virtual cutting frame 400. At least one of the first-type wirings 200 includes a first virtual end surface 2100. At least one of the second-type wirings 300 includes a second virtual end surface 3100. In the top view direction of the display backplane 100, the first virtual end surface 2100 overlaps the virtual cutting frame 400, the second virtual end surface 3100 overlaps with the virtual cutting frame 400, and the first virtual end surface 2100 and the second virtual end surface 3100 are arranged non-overlapping.

When designing the wirings of the display backplane 100, a plurality of cutting frames 800 can be designed. When cutting the substrate 700, different sizes can be cut. The first virtual end surface 2100 corresponds to the first end surface 210. The second virtual end surface 3100 corresponds to the second end surface 310. In the cutting direction perpendicular to the substrate 700, the cutting line passes through only one type of wirings at the same time. In the top view direction, the different types of wirings that overlap with the cutting line do not have overlapping regions. Thus, after the substrate 700 is cut, there is no region where different types of wirings overlap each other on the edge 103 of the display backplane 100. It prevents different types of wirings from being cut at the same time, thereby reducing the risk of abnormal short-circuiting of different types of lines caused by cutting, improving the product yield of the display backplane 100, and improving the display performance.

In some embodiments, in the top view direction of the display backplane 100, the cutting line of the virtual cutting frame 400 can pass through the pixels of the display backplane 100, that is, when cutting, some pixels are damaged to achieve precise cutting size.

In some embodiments, in the top view direction of the display backplane 100, the cutting line of the virtual cutting frame 400 is disposed between two adjacent sub-pixels of the display backplane 100. To reduce damage to pixels, it is not necessary to interrupt first-type wirings 200 or second-type wirings 300 in each pixel. Thus, a design scheme of the original pixel is less affected. At the same time, for the original pixel design, there is no need to interrupt the metal layer many times, and it has almost no effect on the impedance of the metal wirings.

In some embodiments, refer to FIG. 14, FIG. 15, FIG. 17, and FIG. 21, the virtual cutting frame 400 includes a first virtual cutting line 410 parallel to the first direction and a second virtual cutting line 420 parallel to the second direction. At least one of the first-type wirings 200 includes at least one first opening. At least one of the second-type wirings 300 includes at least one second opening 301. In the top view direction of the display backplane 100, the first virtual cutting line 410 passes through the first opening, at least one of the second-type wirings 300 passes through the first opening, the second virtual cutting line 420 passes through the second opening 301, and at least one of the first-type wirings 200 passes through the second opening 301.

By patterning the first-type wirings 200 and the second-type wirings 300 to form holes, at the cutting line, in the top view direction of the display backplane 100, the first-type wirings 200 and the second-type wirings 300 have no region. It prevents different types of wirings from being cut at the same time, thereby reducing the risk of abnormal short-circuiting of different types of wirings caused by cutting, improving the product yield of the display backplane 100, and improving the display performance.

In some embodiments, the first opening and the second opening 301 are arranged successively. In the top view direction of the display backplane 100, the virtual cutting frame 400 is disposed within the first opening and the second opening 301 which are successively arranged.

Figure 14:
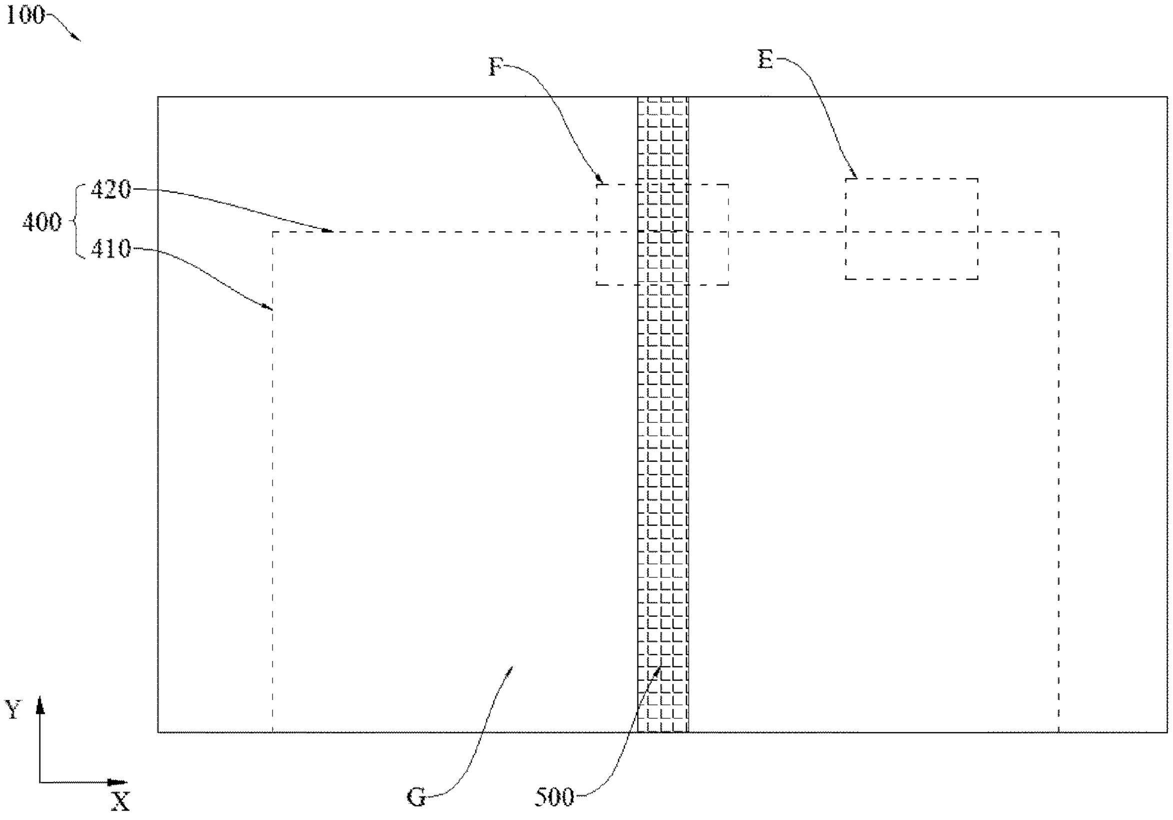
FIG. 14 is a schematic top view of a second structure of a display backplane of an embodiment of the present disclosure.
Figure 22:
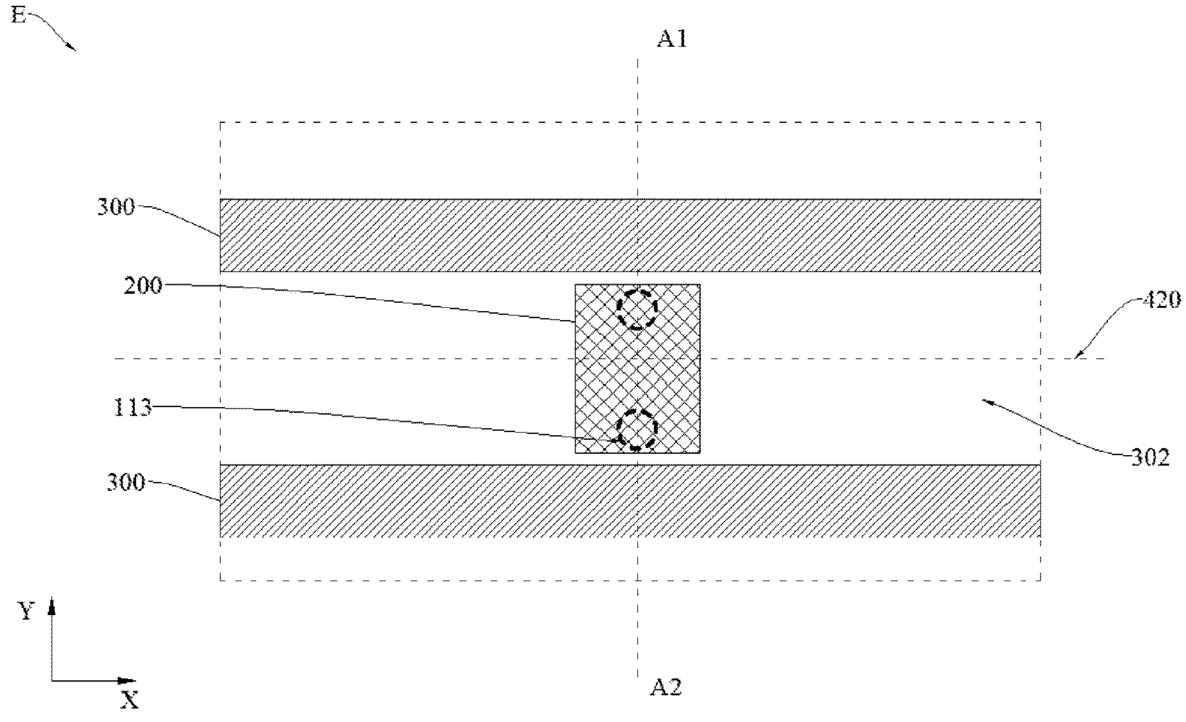
FIG. 22 is a fourth enlarged view of a region E of FIG. 14.

In some embodiments, refer to FIG. 14, FIG. 16, and FIG. 22, the virtual cutting frame 400 includes a first virtual cutting line 410 parallel to the first direction and a second virtual cutting line 420 parallel to the second direction. In the top view direction of the display backplane 100, the first virtual cutting line 410 is disposed between two adjacent first-type wirings 200, and the second virtual cutting line 420 is disposed between two adjacent second-type wirings 300.

In some embodiments, the first virtual end surface 2100 includes a first virtual sub-surface 2110 disposed in the second metal layer 3001, and the second virtual end surface 3100 includes a second virtual sub-surface disposed in the first metal layer 2001.

The first-type wirings 200 originally in the first metal layer 2001 can be disposed at the edge 103 of the display backplane 100, that is, at the virtual cutting line. The first-type wirings 200 perpendicular to the corresponding virtual cutting line are changed to the second metal layer 3001. In this way, at the corresponding virtual cutting line, for the first metal layer 2001 and the second metal layer 3001, only one layer of the two is cut (for the first-type wirings 200, only the second metal layer 3001 is cut when the wirings are changed), which is further reduces the risk of short-circuiting of different types of signal wirings in different layers. The method and principle of the second-type wirings 300 are the same, thereby reducing the risk of abnormal short-circuiting of different types of wirings caused by cutting, improving the product yield of the display backplane 100, and improving the display performance.

Figure 19:
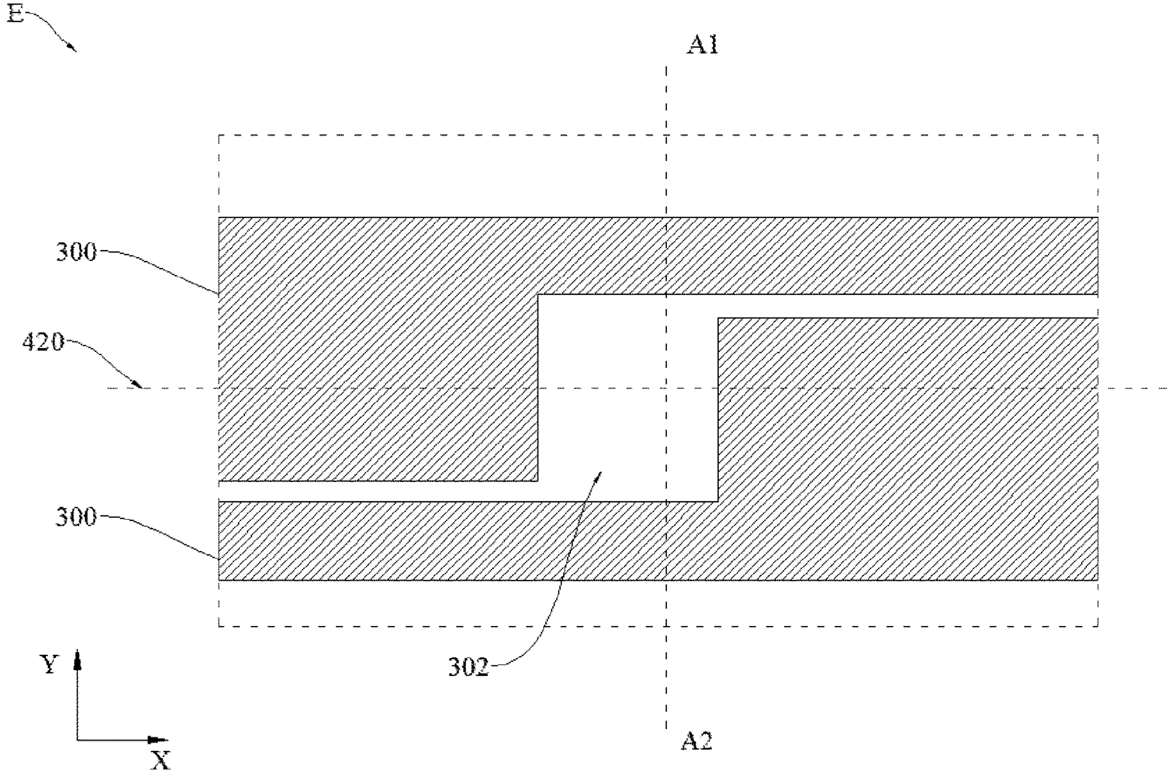
FIG. 19 is a third enlarged view of a region E of FIG. 14.
Figure 20:
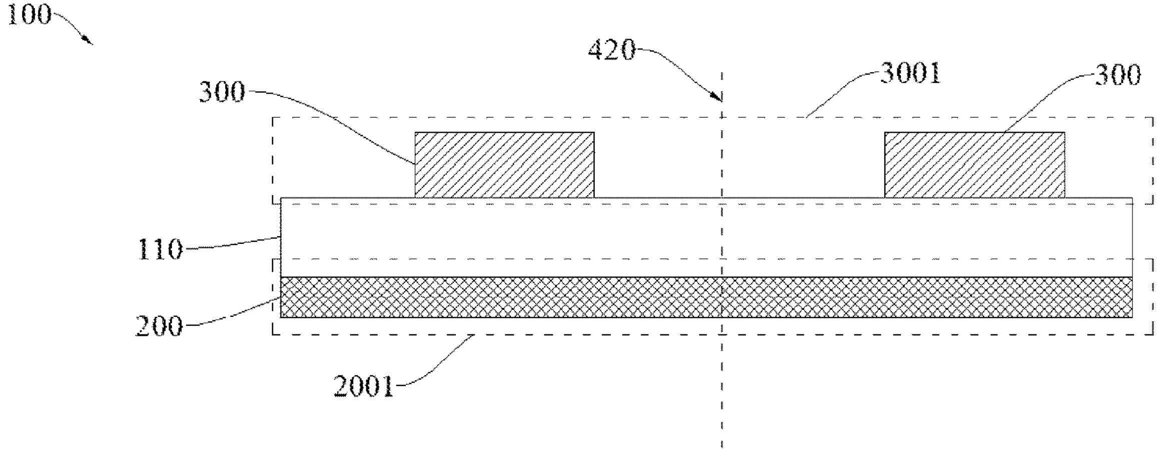
FIG. 20 is a cross-sectional view along A1A2 of FIG. 19.
Figure 21:
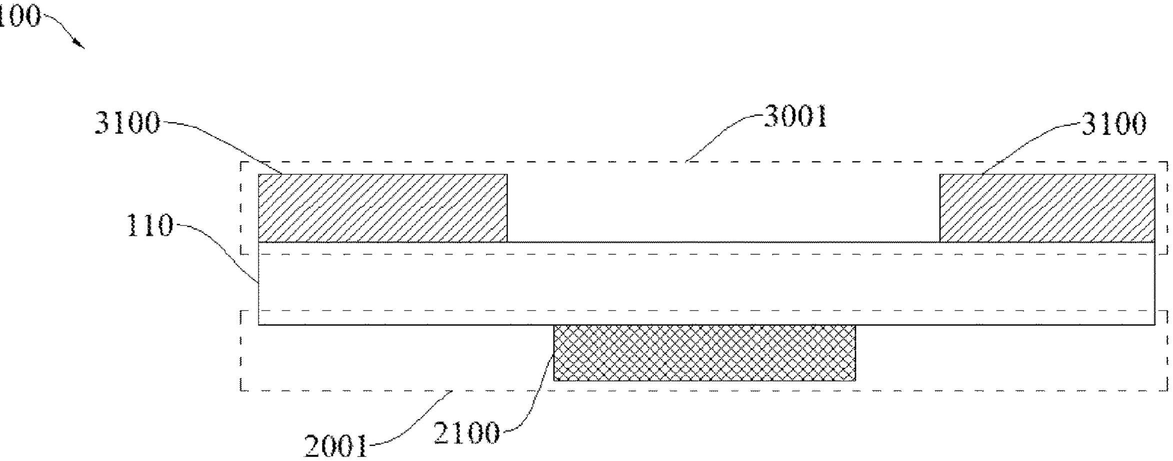
FIG. 21 is a cross-sectional view along a second virtual cutting line 420 of FIG. 15 or FIG. 19.

In some embodiments, refer to FIG. 19 to FIG. 21, the first virtual cutting line 410 passes through two adjacent first-type wirings 200 and a gap between two adjacent first-type wirings 200. At least one of the second-type wirings 300 passes through the gap between two adjacent first-type wirings 200. The second virtual cutting line 420 passes through two adjacent second-type wirings 300 and a gap 302 between two adjacent second-type wirings 300. At least one of the first-type wirings 200 passes through the gap 302 between two adjacent second-type wirings 300.

Figure 23:
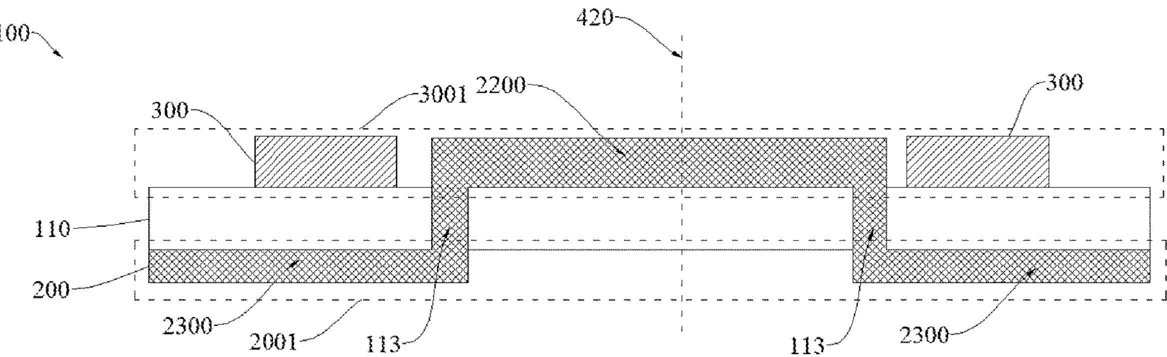
FIG. 23 is a first cross-sectional view along A1A2 of FIG. 22.
Figure 24:
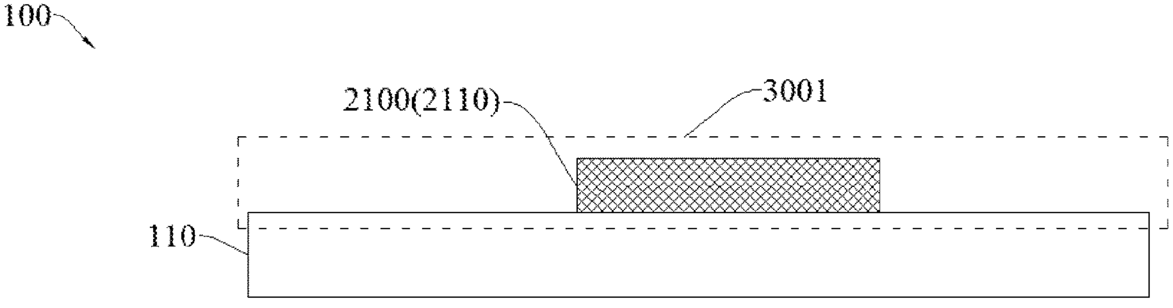
FIG. 24 is a first sectional view along a second virtual cutting line 420 of FIG. 22.

In some embodiments, refer to FIG. 22 to FIG. 24, the first-type wiring 200 including the first virtual sub-surface 2110 includes a first sub-portion 2200 and a second sub-portion 2300. The first sub-portion 2200 is disposed in the second metal layer 3001. In the top view direction of the display backplane 100, the first sub-portion 2200 passes through the virtual cutting frame 400. The second sub-portion 2300 is disposed in the first metal layer 2001. The second-type wiring 300 including the second virtual sub-surface includes a third sub-portion and a fourth sub-portion. The third sub-portion is disposed in the first metal layer 2001. In the top view direction of the display backplane 100, the third sub-portion passes through the virtual cutting frame 400. The fourth sub-portion is disposed in the second metal layer 3001. The insulating layer 110 includes a plurality of third via holes 113 and a plurality of fourth via holes, the second sub-portion 2300 is connected to both ends of the first sub-portion 2200 through the third via holes 113, and the fourth sub-portion is connected to both ends of the third sub-portion through the fourth via holes.

The first-type wirings 200 are connected to the second metal layer 3001 through the third via holes 113 for jumper wiring. The second-type wirings 300 are connected to the first metal layer 2001 through the fourth via holes for jumper wiring. At the corresponding virtual cutting line, for the first metal layer 2001 and the second metal layer 3001, only one layer of the two is cut, which further reduces the risk of short-circuiting of different types of signal wirings in different layers. The wire changing method and principle of the second-type wirings 300 are the same. Thus, the risk of abnormal short-circuiting of different types of wirings caused by cutting is reduced, the product yield of the display backplane 100 is improved, and the display performance is improved.

Figure 25:
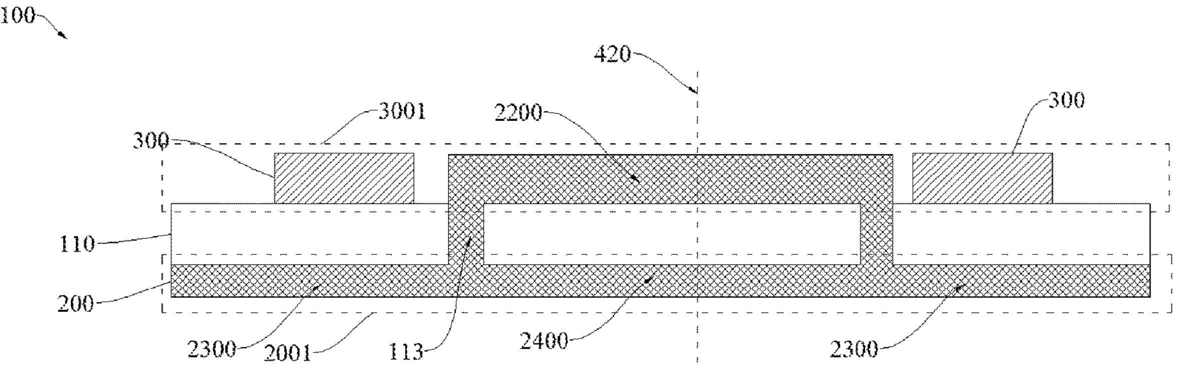
FIG. 25 is a second cross-sectional view along A1A2 of FIG. 22.
Figure 26:
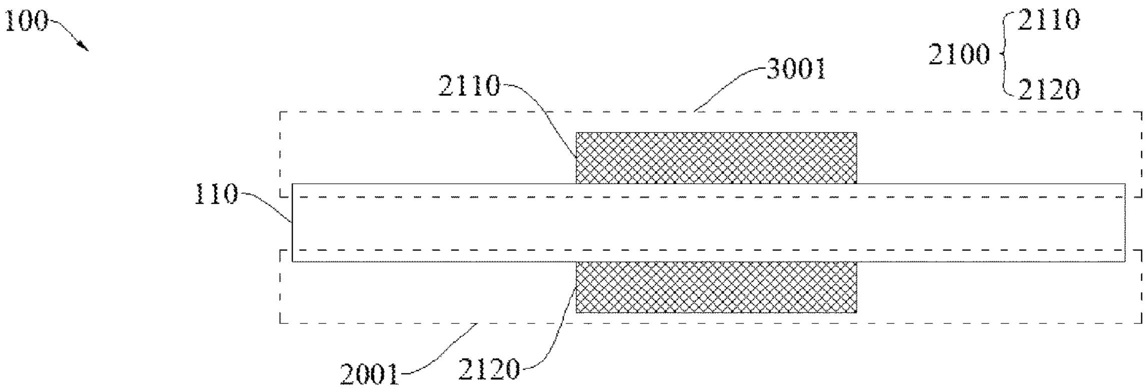
FIG. 26 is a second cross-sectional view along a second virtual cutting line 420 of FIG. 22.

In some embodiments, refer to FIG. 22, FIG. 25, and FIG. 26, the first virtual end surface 2100 including the first virtual sub-surface 2110 further includes a third virtual sub-surface 2120 disposed in the first metal layer 2001. The second virtual end surface 3100 including the second virtual sub-surface also includes a fourth virtual sub-surface disposed in the second metal layer 3001. In the top view direction of the display backplane 100, the first virtual sub-surface 2110 overlaps with the corresponding third virtual sub-surface 2120, and the second virtual sub-surface overlaps with the corresponding fourth virtual sub-surface.

At cutting surfaces of different layers, upper and lower overlapping regions correspond to the two signal wirings of the same type. Even if upper and lower wirings are shorted during cutting (for example, wirings corresponding to the first sub-surface 211 and the third sub-surface 212 of the first-type wirings 200 are short-circuited on a side surface), the two wirings are the same wirings of the same type of wirings, and there is no need to worry about short-circuit causing abnormal signal, and parallel connection can be realized to reduce the line resistance. It is not necessary to interrupt the first-type wirings 200 or the second-type wirings 300 within each pixel. Thus, a design scheme of the original pixel is less affected. At the same time, for the original pixel design, there is no need to interrupt the metal layer many times, and it has almost no effect on the impedance of the metal wirings. Therefore, the risk of abnormal short-circuiting of different types of wirings caused by cutting is reduced, the product yield of the display backplane 100 is improved, and the display performance is improved.

In some embodiments, refer to FIG. 22, FIG. 25, and FIG. 26, the first-type wiring 200 including the first virtual sub-surface 2110 further includes a fifth sub-portion 2400 connected to the second sub-portion 2300 and disposed in the same layer as the second sub-portion 2300. The second-type wirings 300 including the second virtual second sub-surface 3110 also include a sixth sub-portion connected to the fourth sub-portion and disposed in the same layer as the fourth sub-portion.

The fifth sub-portion 2400 corresponds to the third virtual sub-surface 2120, and the sixth sub-portion corresponds to the fourth virtual sub-surface. During cutting, for example, the first sub-portion 2200 and fifth sub-portion 2400 of the first-type wirings 200 are short-circuited on the side surface, and the two wirings are the same wiring of the same type of wiring. There is no need to worry about signal abnormality caused by short circuit, and parallel connection can be realized to reduce wiring resistance. Therefore, the risk of abnormal short-circuiting of different types of wirings caused by cutting is reduced, the product yield of the display backplane 100 is improved, and the display performance is improved.

Figure 13:
FIG. 13 is an enlarged view of a region D of FIG. 1.
Figure 13:
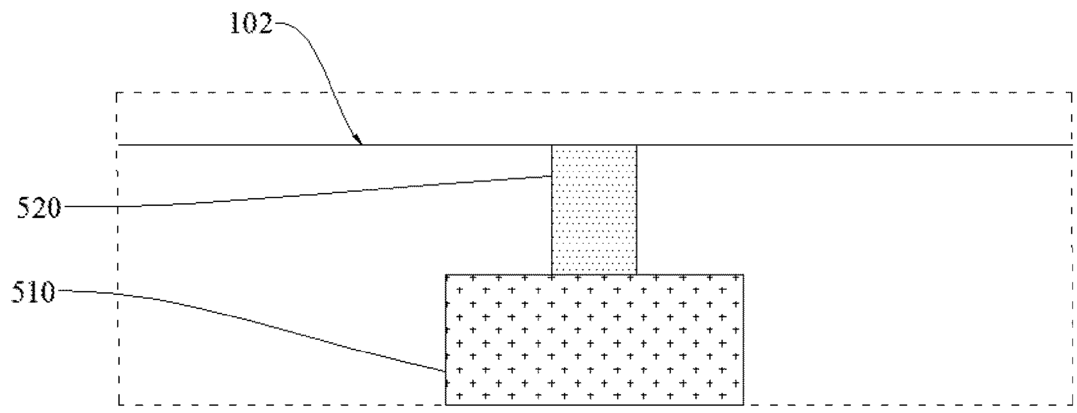

In some embodiments, refer to FIG. 1 and FIG. 13, the display backplane 100 includes a display area G and a non-display area disposed at a bottom of the display area G. The display backplane 100 further includes a gate driving component 500 disposed in the display area G.

When cutting at any size, the cutting line of the upper left and right edges 103 can be cut directly without considering the influence on the gate driving component 500.

In some embodiments, refer to FIG. 1 and FIG. 13, the gate driving component 500 includes a plurality of gate driving devices 510 and a gate driving connecting line 520 connecting two adjacent gate driving devices 510. In the top view direction of the display backplane 100, an arrangement direction of the gate driving connecting lines 520 and the gate driving devices 510 is perpendicular to the edge 103 of the display backplane 100. The gate driving connecting line 520 includes an end surface that is flush with the corresponding edge 103.

The cutting line extends to the gate driving connecting line 520, which can reduce damage to the gate driving devices 510, avoid driving failure, and facilitate the layout of other devices.

Figure 27:
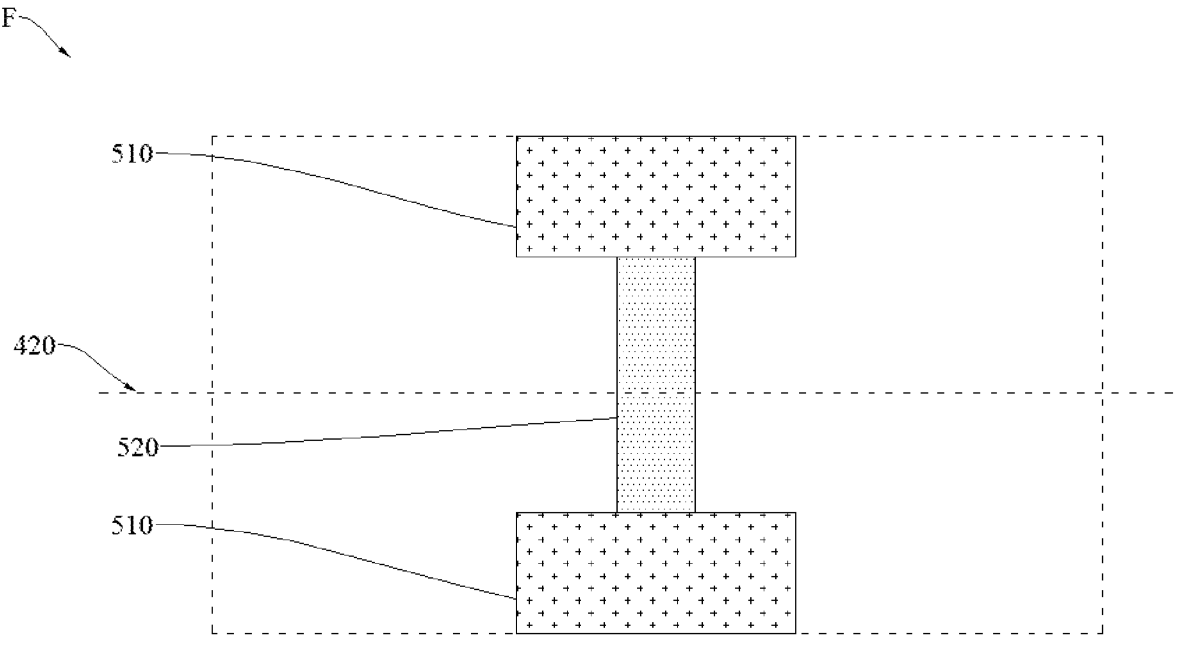
FIG. 27 is an enlarged view of a region F of FIG. 14.

In some embodiments, refer to FIG. 14 and FIG. 27, in the top view direction of the display backplane 100, the virtual cutting frame 400 passes through the gate driving connecting line 520. For example, the arrangement direction of the gate driving connecting line 520 and the gate driving devices 510 is the first direction. The second virtual cutting line 420 passes through the gate driving connecting line 520. The damage to the gate driving devices 510 can be reduced, so as to avoid driving failure and facilitate the layout of other devices.

In some embodiments, the display backplane 100 includes a substrate 120, an active layer on the substrate 120, a first insulating layer on the active layer, a gate layer on the first insulating layer, a second insulating layer on the gate layer, and a source-drain layer on the second insulating layer.

In some embodiments, the source-drain layer may be used as the wiring layer, that is, the source-drain layer includes the first metal layer 2001, the insulating layer 110, and the second metal layer 3001.

In some embodiments, the display backplane 100 can be used as a driving array device of the display device 10 for direct display, and can also be used as a driving array device of the backlight unit, which is not specifically limited herein.

In some embodiments, when the display backplane 100 is a direct display type, the display backplane 100 further includes a light emitting device. The light-emitting device may include an organic light-emitting diode (OLED) material, and may also include a micro-LED or a mini-LED, which is not specifically limited herein.

In the present disclosure, by optimizing an arrangement and patterning of the wirings, the cutting line is arranged in a region where two different types of wirings do not overlap. It prevents different types of wirings from being cut at the same time, thereby reducing a risk of abnormal short-circuiting of different types of lines caused by cutting, improving a product yield of the display backplane, and improving a display performance.

Figure 28:
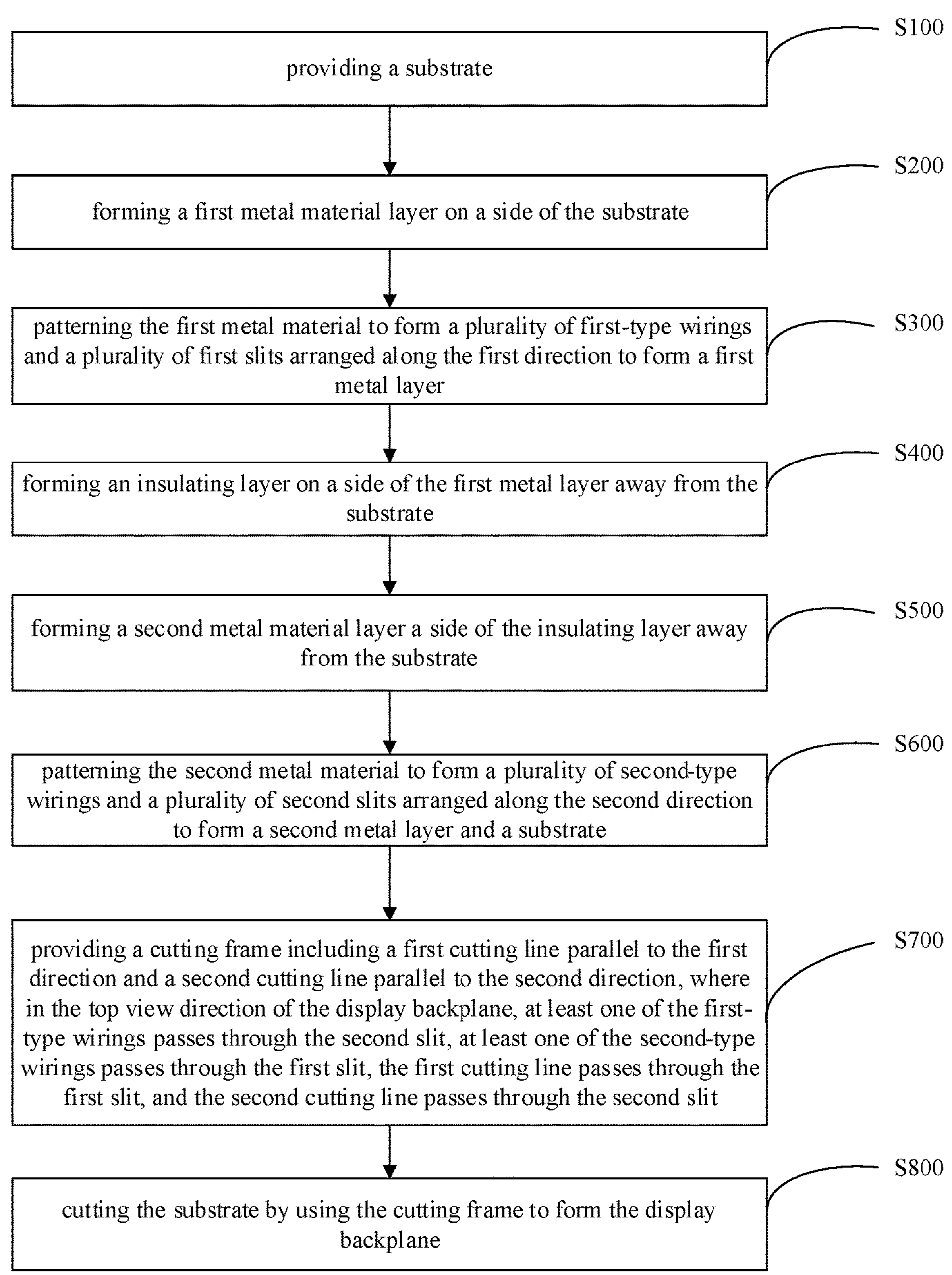
FIG. 28 is a flowchart of a manufacturing method of a display backplane of an embodiment of the present disclosure.

Referring to FIG. 28, an embodiment of the present disclosure also provides a manufacturing method of a display backplane 100, including:

S100, a substrate 120 is provided.

S200, a first metal material layer is formed on a side of the substrate 120.

S300, the first metal material is patterned to form a plurality of first-type wirings 200 and a plurality of first slits arranged along the first direction to form a first metal layer 2001.

S400, an insulating layer 110 is formed on a side of the first metal layer 2001 away from the substrate 120.

S500, a second metal material layer 600 is formed on a side of the insulating layer 110 away from the substrate 120.

S600, the second metal material is patterned to form a plurality of second-type wirings 300 and a plurality of second slits 610 arranged along the second direction to form a second metal layer 3001 and a substrate 700.

S700, a cutting frame 800 including a first cutting line 810 parallel to the first direction and a second cutting line 820 parallel to the second direction is provided. In the top view direction of the display backplane 100, at least one of the first-type wirings 200 passes through the second slit 610, at least one of the second-type wirings 300 passes through the first slit, the first cutting line 810 passes through the first slit, and the second cutting line 820 passes through the second slit 610.

S800, the substrate 700 is cut by using the cutting frame 800 to form the display backplane 100.

In the present disclosure, by optimizing an arrangement and patterning of the wirings, the cutting line is arranged in a region where two different types of wirings do not overlap. It prevents different types of wirings from being cut at the same time, thereby reducing a risk of abnormal short-circuiting of different types of lines caused by cutting, improving a product yield of the display backplane, and improving a display performance.

The technical solutions of the present disclosure will now be described with reference to specific embodiments.

Figure 29A:
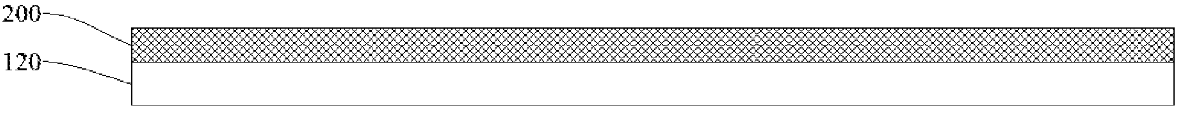
FIG. 29A to FIG. 29E are schematic diagrams showing a manufacturing method of a display backplane of an embodiment of the present disclosure.

In this embodiment, the manufacturing method of the display backplane 100 includes:

S100, a substrate 120 is provided, refer to FIG. 29A.

In some embodiments, material of the substrate 120 may be a hard material, such as glass, or a flexible material, such as polyimide, which is not specifically limited herein.

S200, a first metal material layer is formed on a side of the substrate 120.

In some embodiments, the first metal material layer may be a layer of metal, or may be a multi-layer metal layer, which is not specifically limited herein.

S300, the first metal material is patterned to form a plurality of first-type wirings 200 and a plurality of first slits arranged along the first direction to form a first metal layer 2001, refer to FIG. 29A.

Figure 29B:
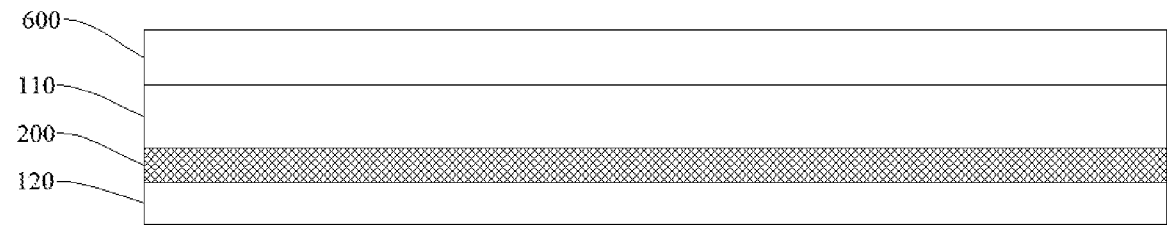

S400, an insulating layer 110 is formed on a side of the first metal layer 2001 away from the substrate 120, refer to FIG. 29B.

In some embodiments, the step S400 includes:

S410*a*, the insulating layer 110 including a plurality of first via holes 111 and a plurality of second via holes is formed on the side of the first metal layer 2001 away from the substrate 120.

In some embodiments, the step S400 includes:

S410*b*, the insulating layer 110 including a plurality of first via holes 111, a plurality of second via holes, a plurality of third via holes 113, and a plurality of fourth via holes is formed on the side of the first metal layer 2001 away from the substrate 120.

S500, a second metal material layer 600 is formed on a side of the insulating layer 110 away from the substrate 120, refer to FIG. 29B.

In some embodiments, the second metal material layer 600 may be a layer of metal, or may be a multi-layer metal layer, which is not specifically limited herein.

Figure 29C:
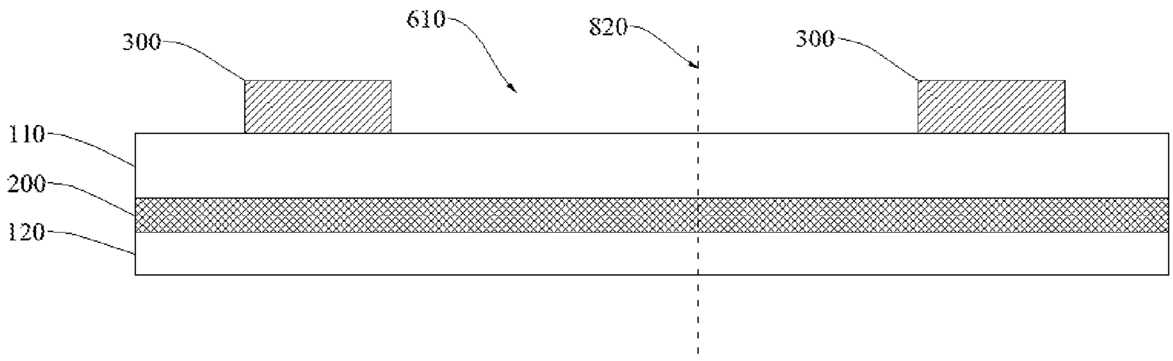
Figure 29D:
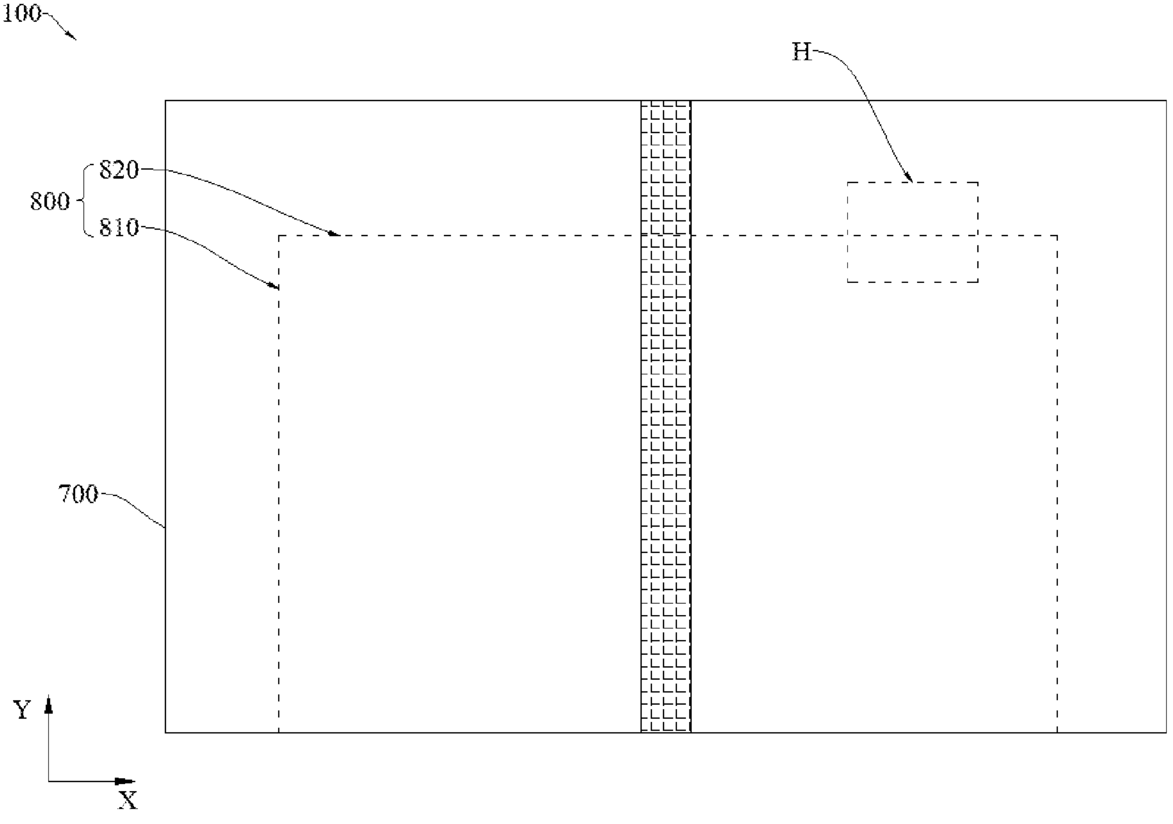

S600, the second metal material is patterned to form a plurality of second-type wirings 300 and a plurality of second slits 610 arranged along the second direction to form a second metal layer 3001 and a substrate 700, refer to FIG. 29C and FIG. 29D.

In some embodiments, the first slit and the second slit 610 may respectively be the first opening and the second opening 301 of the display backplane 100, and may also respectively be a gap between two adjacent first-type wirings 200 and a gap 302 between two adjacent second-type wirings 300.

During wiring, the first-type wiring 200 includes at least one first opening, and at least one of the second-type wirings 300 includes at least one second opening 301. In the top view direction of the display backplane 100, at least one of the first-type wirings 200 passes through the second opening 301, at least one of the second-type wirings 300 passes through the first opening, the first cutting line 810 passes through the first opening, and the second cutting line 820 passes through the second opening 301. Alternatively, the gap 302 between two adjacent first-type wirings 200 or two adjacent second-type wirings 300 is patterned so that a portion of an edge of the gap is located on the cutting line. In the top view direction of the display backplane 100, a space occupied by the metal wirings is increased, and the metal wirings can reflect light, which can improve the reflection of display light, thereby improving a display luminous efficiency.

S700, a cutting frame 800 including a first cutting line 810 parallel to the first direction and a second cutting line 820 parallel to the second direction is provided. In the top view direction of the display backplane 100, at least one of the first-type wirings 200 passes through the second slit 610, at least one of the second-type wirings 300 passes through the first slit, the first cutting line 810 passes through the first slit, and the second cutting line 820 passes through the second slit 610, refer to FIG. 29C and FIG. 29E.

Figure 29E:
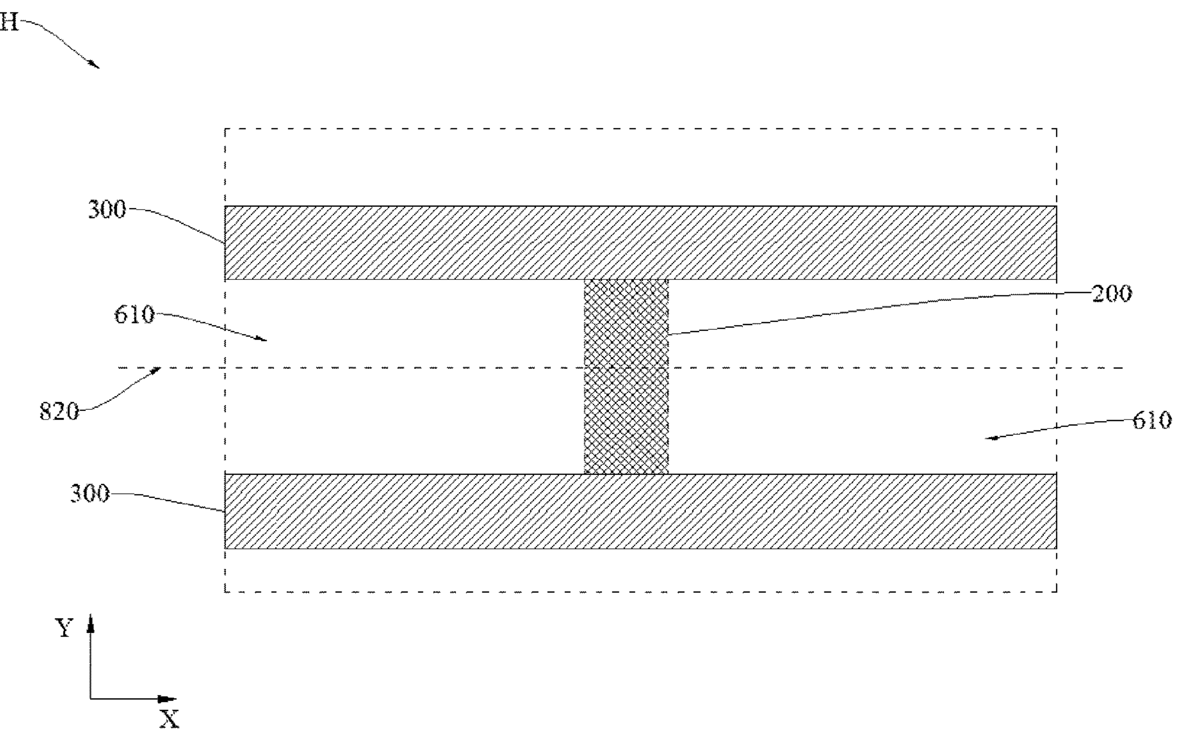

FIG. 29E is a top perspective view of a region H of FIG. 29D. When cutting the substrate 700, in the cutting direction perpendicular to the substrate 700, the cutting line only passes through one type of wirings. In the top view direction, the different types of wirings that overlap with the cutting line do not have overlapping regions. Therefore, after the substrate 700 is cut, there is no region where different types of wirings overlap each other on the edge 103 of the display backplane 100. It prevents different types of wirings from being cut at the same time, thereby reducing the risk of abnormal short-circuiting of different types of wirings caused by cutting, improving the product yield of the display backplane 100, and improving the display performance.

In some embodiments, in the top view direction of the display backplane 100, the cutting line of the cutting frame 800 is arranged between two adjacent sub-pixels of the display backplane 100. To reduce damage to pixels, it is not necessary to interrupt the first-type wirings 200 or the second-type wirings 300 in each pixel. Thus, a design scheme of the original pixel is less affected. At the same time, for the original pixel design, there is no need to interrupt the metal layer many times, and it has almost no effect on the impedance of the metal wirings.

In some embodiments, the cutting frame 800 includes a first cutting line 810 parallel to the first direction and a second cutting line 820 parallel to the second direction. At least one of the first-type wirings 200 includes at least one first opening, and at least one of the second-type wirings 300 includes at least one second opening 301. In the top view direction of the display backplane 100, the first cutting line 810 passes through the first opening, at least one of the second-type wirings 300 passes through the first opening, the second cutting line 820 passes through the second opening 301, and at least one of the first-type wirings 200 passes through the second opening 301.

In some embodiments, the first opening and the second opening 301 are successively arranged. In the top view direction of the display backplane 100, the cutting frame 800 is disposed within the first opening and the second opening 301 which are successively arranged.

In some embodiments, the cutting frame 800 includes a first cutting line 810 parallel to the first direction and a second cutting line 820 parallel to the second direction. In the top view direction of the display backplane 100, the first cutting line 810 is disposed between two adjacent first-type wirings 200, and the second cutting line 820 is disposed between two adjacent second-type wirings 300.

In some embodiments, the first end surface 210 includes a first sub-surface 211 disposed in the second metal layer 3001, and the second end surface 310 includes a second sub-surface disposed in the first metal layer 2001.

In some embodiments, the first-type wiring 200 including the first sub-surface 211 includes a first sub-portion 2200 and a second sub-portion 2300. The first sub-portion 2200 is disposed in the second metal layer 3001. In the top view direction of the display backplane 100, the first sub-portion 2200 passes through the cutting frame 800. The second sub-portion 2300 is disposed in the first metal layer 2001. The second-type wiring 300 including the second sub-surface includes a third sub-portion and a fourth sub-portion. The third sub-portion is disposed in the first metal layer 2001. In the top view direction of the display backplane 100, the third sub-portion passes through the cutting frame 800. The fourth sub-portion is disposed in the second metal layer 3001. The insulating layer 110 includes a plurality of third via holes 113 and a plurality of fourth via holes, the second sub-portion 2300 is connected to both ends of the first sub-portion 2200 through the third via holes 113, and the fourth sub-portion is connected to both ends of the third sub-portion through the fourth via holes.

In some embodiments, the first end surface 210 including the first sub-surface 211 also includes a third sub-surface 212 disposed in the first metal layer 2001. The second end surface 310 including the second sub-surface also includes a fourth sub-surface disposed in the second metal layer 3001. In the top view direction of the display backplane 100, the first sub-surface 211 overlaps with the corresponding third sub-surface 212, and the second sub-surface overlaps with the corresponding fourth sub-surface.

In some embodiments, the display backplane 100 includes a display area G and a non-display area surrounding the display area G. The display backplane 100 further includes a gate driving component 500 disposed in the display area G.

In some embodiments, the gate driving component 500 includes a plurality of gate driving devices 510 and a gate driving connecting line 520 connecting two adjacent gate driving devices 510. In the top view direction of the display backplane 100, the arrangement direction of the gate driving connecting lines 520 and the gate driving devices 510 is perpendicular to the edge 103 of the display backplane 100. The gate driving connecting line 520 includes an end surface that is flush with the corresponding edge 103.

S800, the substrate 700 is cut by using the cutting frame 800 to form the display backplane 100.

In the present disclosure, by optimizing an arrangement and patterning of the wirings, the cutting line is arranged in a region where two different types of wirings do not overlap. It prevents different types of wirings from being cut at the same time, thereby reducing a risk of abnormal short-circuiting of different types of lines caused by cutting, improving a product yield of the display backplane, and improving a display performance.

Figure 30:
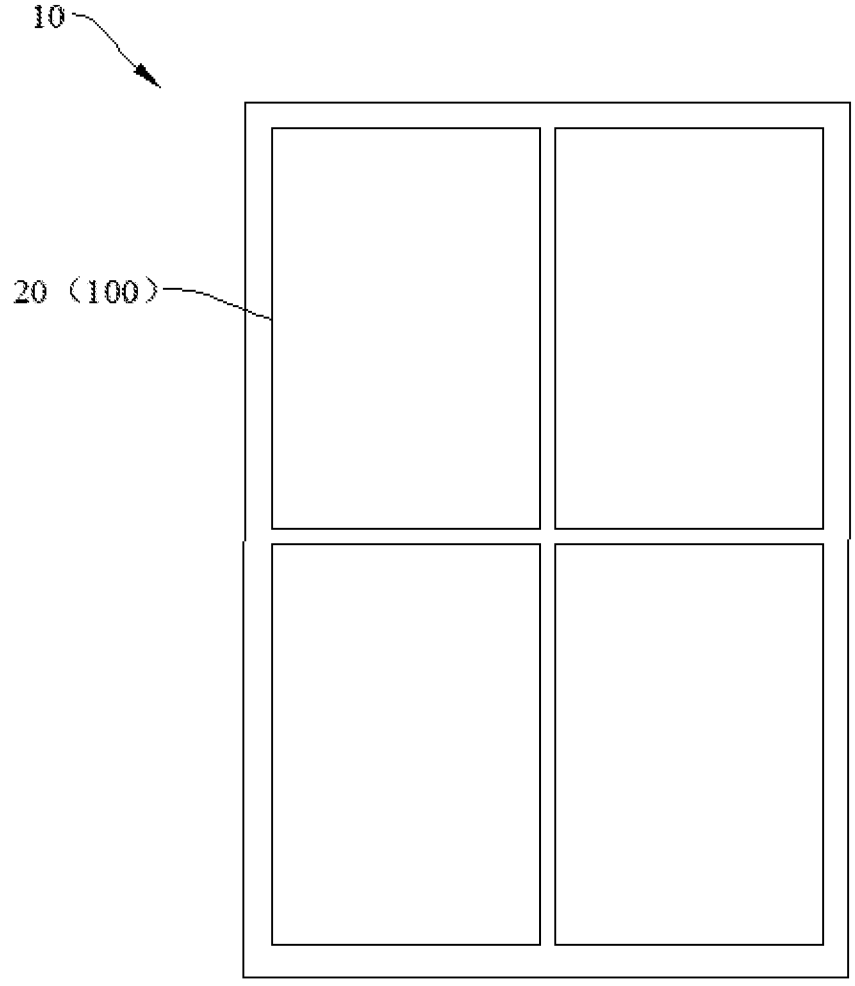
FIG. 30 is a schematic structural diagram of a display device of an embodiment of the present disclosure.

Referring to FIG. 30, an embodiment of the present disclosure further provides a display device 10 including at least two splicing screens 20. The splicing screen 20 includes a display backplane 100 as described above.

For the specific structure of the display backplane 100, reference may be made to any of the above-mentioned embodiments of the display backplane 100 and the accompanying drawings, and details are not described herein again.

In this embodiment, the display device 10 further includes a device body. The device body may include a middle frame, a sealant, and the like. The display device 10 may be a display terminal such as a mobile phone, a tablet, or a TV, which is not limited herein.

In some embodiments, the display backplane 100 can be used as a driving array device of the display device 10 for direct display, and can also be used as a driving array device of the backlight unit, which is not specifically limited herein.

In some embodiments, the display backplane 100 is used as a driving array device of the display device 10 of direct display. The display device 10 further includes a light-emitting device, and the light-emitting device may include an organic light-emitting diode (OLED) material, or may include a micro-LED or a mini-LED, which is not specifically limited herein.

In some embodiments, the display backplane 100 is used as a driving array device of a backlight unit, and the display device 10 further includes a backlight unit, a liquid crystal layer, a color filter layer, and an upper and lower polarizing layer.

The embodiments of the present disclosure disclose the display backplane and the display device. The display backplane includes the wiring layer. The wiring layer includes the plurality of first-type wirings arranged along the first direction and the plurality of second-type wirings arranged along the second direction. At least one of the first-type wirings includes the first end surface that is flush with the edge of the display backplane. At least one of the second-type wirings includes the second end surface flush with the edge of the display backplane. In the top view direction of the display backplane, the first end surface and the second end surface are arranged non-overlapping. In the present disclosure, by optimizing an arrangement and patterning of the wirings, the cutting line is arranged in a region where two different types of wirings do not overlap. It prevents different types of wirings from being cut at the same time, thereby reducing a risk of abnormal short-circuiting of different types of lines caused by cutting, improving a product yield of the display backplane, and improving a display performance.

It can be understood that for those of ordinary skill in the art, equivalent replacements or changes can be made according to the technical solutions of the present disclosure and its inventive concept, and all such changes or replacements shall belong to the protection scope of the appended claims of the present disclosure.

What is claimed is:

1. A display backplane, comprising a wiring layer, wherein the wiring layer comprises:

a plurality of first-type wirings arranged along a first direction, wherein at least one of the first-type wirings comprises a first end surface that is flush with an edge of the display backplane; and a plurality of second-type wirings arranged along a second direction, wherein the first direction is perpendicular to the second direction, and at least one of the second-type wirings comprises a second end surface that is flush with the edge of the display backplane; and wherein the first-type wirings are insulated from the second-type wirings, and in a top view direction of the display backplane, the first end surface and the second end surface are arranged non-overlapping.

2. The display backplane according to claim 1, wherein any one of the first end surfaces is parallel to the second direction, and any one of the second end surfaces is parallel to the first direction.

3. The display backplane according to claim 2, wherein the wiring layer comprises a first metal layer, a second metal layer, and an insulating layer disposed between the first metal layer and the second metal layer; and the first end surface parallel to the second direction comprises a first sub-surface disposed in the second metal layer, and the second end surface parallel to the first direction comprises a second sub-surface disposed in the first metal layer.

4. The display backplane according to claim 3, wherein the first-type wiring comprising the first sub-surface comprises:

a first portion arranged close to a corresponding edge of the display backplane, and disposed in the second metal layer; and a second portion, arranged away from the corresponding edge of the display backplane, and disposed in the first metal layer;

wherein the second-type wiring comprising the second sub-surface comprises:

a third portion arranged close to the corresponding edge of the display backplane, and disposed in the first metal layer; and a fourth portion arranged away from the corresponding edge of the display backplane, and disposed in the second metal layer;

wherein the insulating layer comprises a plurality of first via holes and a plurality of second via holes, the first portion is connected to the second portion through the first via holes, and the third portion is connected to the fourth portion through the second via holes.

5. The display backplane according to claim 3, wherein the first end surface comprising the first sub-surface also comprises a third sub-surface disposed in the first metal layer, and the second end surface comprising the second sub-surface also comprises a fourth sub-surface disposed in the second metal layer;

wherein in the top view direction of the display backplane, the first sub-surface correspondingly overlaps with the third sub-surface, and the second sub-surface correspondingly overlaps with the fourth sub-surface.

6. The display backplane according to claim 2, wherein the display backplane comprises a first edge parallel to the first direction and a second edge parallel to the second direction;

wherein one of the first-type wirings closest to the first edge comprises a first protrusion toward to the first edge, and one of the second-type wirings closest to the second edge comprising a second protrusions toward the second edge.

7. The display backplane according to claim 6, wherein in the top view direction of the display backplane, a side surface of the first protrusion close to the first edge is flush with the first edge, and a side surface of the second protrusion close to the second edge is flush with the second edge.

8. The display backplane according to claim 1, wherein at least one of the first end surfaces is parallel to the second direction, at least one of the first end surfaces is parallel to the first direction, at least one of the second end surfaces is parallel to the second direction, and at least one of the second end surfaces is parallel to the first direction.

9. The display backplane according to claim 8, wherein the wiring layer comprises a first metal layer, a second metal layer, and an insulating layer disposed between the first metal layer and the second metal layer;

the first end surface parallel to the second direction comprises a first sub-surface disposed in the second metal layer, and the second end surface parallel to the first direction comprises a second sub-surface disposed in the first metal layer.

10. The display backplane according to claim 8, wherein the display backplane comprises a first edge parallel to the first direction and a second edge parallel to the second direction; and wherein one of the first-type wirings closest to the first edge comprises the first protrusion toward the first edge, and one of the second-type wirings closest to the second edge comprises a second protrusions toward the second edge.

11. The display backplane according to claim 1, wherein the display backplane comprises at least one virtual cutting frame;

at least one of the first-type wirings comprises a first virtual end surface, and at least one of the second-type wirings comprises a second virtual end surface; and in the top view direction of the display backplane, the first virtual end surface overlaps with the virtual cutting frame, the second virtual end surface overlaps with the virtual cutting frame, and the first virtual end surface and the second virtual end surface are arranged non-overlapping.

12. The display backplane according to claim 11, wherein the virtual cutting frame comprises a first virtual cutting line parallel to the first direction and a second virtual cutting line parallel to the second direction;

at least one of the first-type wirings comprises at least one first opening, and at least one of the second-type wirings comprises at least one second opening;

in the top view direction of the display backplane, the first virtual cutting line passes through the first opening, at least one of the second-type wirings passes through the first opening, the second virtual cutting line passes through the second opening, and at least one of the first-type wirings passes through the second opening.

13. The display backplane according to claim 11, wherein the virtual cutting frame comprises a first virtual cutting line parallel to the first direction and a second virtual cutting line parallel to the second direction;

in the top view direction of the display backplane, the first virtual cutting line is disposed between two adjacent first-type wirings, and the second virtual cutting line is disposed between two adjacent second-type wirings.

14. The display backplane according to claim 11, wherein the wiring layer comprises a first metal layer, a second metal layer, and an insulating layer disposed between the first metal layer and the second metal layer;

the first virtual end surface comprises a first virtual sub-surface disposed in the second metal layer, and the second virtual end surface comprises a second virtual sub-surface disposed in the first metal layer.

15. The display backplane according to claim 14, wherein the first-type wiring comprising the first virtual sub-surface comprises:

a first sub-portion disposed in the second metal layer, wherein in the top view direction of the display backplane, the first sub-portion passes through the virtual cutting frame; and a second sub-portion disposed in the first metal layer;

wherein the second-type wiring comprising the second virtual sub-surface comprises:

a third sub-portion disposed in the first metal layer, wherein in the top view direction of the display backplane, the third sub-portion passes through the virtual cutting frame; and a fourth sub-portion disposed in the second metal layer;

wherein the insulating layer comprises a plurality of third via holes and a plurality of fourth via holes, the second sub-portion is connected to both ends of the first sub-portion through the third via holes, and the fourth sub-portion is connected to both ends of the third sub-portion through the fourth via holes.

16. The display backplane according to claim 14, wherein the first virtual end surface comprising the first virtual sub-surface further comprises a third virtual sub-surface disposed in the first metal layer, and the second virtual end surface comprising the second virtual sub-surface also comprises a fourth virtual sub-surface disposed in the second metal layer;

wherein in the top view direction of the display backplane, the first virtual sub-surface overlaps with the corresponding third virtual sub-surface, and the second virtual sub-surface overlaps with the corresponding fourth virtual sub-surface.

17. The display backplane according to claim 11, wherein in the top view direction of the display backplane, a cutting line of the virtual cutting frame is disposed between two adjacent sub-pixels of the display backplane.

18. The display backplane according to claim 1, wherein the display backplane comprises a display area and a non-display area at a bottom of the display area, and the display backplane further comprises a gate driving component disposed in the display area.

19. The display backplane according to claim 18, wherein the gate driving component comprises a plurality of gate driving devices and a gate driving connecting line connecting two adjacent gate driving devices;

in the top view direction of the display backplane, an arrangement direction of the gate driving connecting line and the gate driving devices is perpendicular to an edge of the display backplane, and the gate driving connecting line comprises an end surface that is flush with the corresponding edge.

20. A display device, comprising at least two splicing screens, wherein one of the splicing screens comprises a display backplane, the display backplane comprises a wiring layer, and the wiring layer comprises:

a plurality of first-type wirings arranged along a first direction, wherein at least one of the first-type wirings comprises a first end surface that is flush with an edge of the display backplane; and a plurality of second-type wirings arranged along a second direction, wherein the first direction is perpendicular to the second direction, and at least one of the second-type wirings comprises a second end surface that is flush with the edge of the display backplane; and wherein the first-type wirings are insulated from the second-type wirings, and in a top view direction of the display backplane, the first end surface and the second end surface are arranged non-overlapping.

* * * * *